(12) United States Patent
Ajit

(10) Patent No.: US 6,847,248 B2
(45) Date of Patent: Jan. 25, 2005

(54) SUB-MICRON HIGH INPUT VOLTAGE TOLERANT INPUT OUTPUT (I/O) CIRCUIT WHICH ACCOMMODATES LARGE POWER SUPPLY VARIATIONS

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/043,763

(22) Filed: Jan. 9, 2002

(65) Prior Publication Data

US 2002/0175743 A1 Nov. 28, 2002

Related U.S. Application Data

(60) Provisional application No. 60/260,580, filed on Jan. 9, 2001, and provisional application No. 60/260,582, filed on Jan. 9, 2001.

(51) Int. Cl.$^7$ ................................................ H03L 5/00
(52) U.S. Cl. ...................... 327/313; 327/314; 327/328; 361/91.5
(58) Field of Search ................................ 327/310, 313, 327/314, 320, 325, 328; 361/91.2, 91.5, 91.1

(56) References Cited

U.S. PATENT DOCUMENTS

| | | | |
|---|---|---|---|
| 4,473,758 A | * | 9/1984 | Huntington ................ 327/537 |
| 4,484,244 A | * | 11/1984 | Avery ......................... 361/56 |
| 4,556,804 A | * | 12/1985 | Dewitt ........................ 327/434 |
| 4,617,473 A | * | 10/1986 | Bingham ..................... 327/546 |
| 4,649,292 A | * | 3/1987 | Rusznyak .................... 327/82 |
| 4,686,388 A | * | 8/1987 | Hafner ......................... 327/537 |
| 4,806,789 A | * | 2/1989 | Sakihama et al. ........... 327/437 |
| 5,170,078 A | | 12/1992 | Hsueh et al. |
| 5,184,031 A | * | 2/1993 | Hayakawa et al. ......... 327/544 |
| 5,208,488 A | * | 5/1993 | Takiba et al. ................ 327/77 |
| 5,350,951 A | * | 9/1994 | Adachi ....................... 327/546 |
| 5,506,535 A | | 4/1996 | Ratner |
| 5,528,447 A | | 6/1996 | McManus et al. |
| 5,570,043 A | | 10/1996 | Churchill |
| 5,654,858 A | * | 8/1997 | Martin et al. ................ 361/56 |
| 5,721,508 A | | 2/1998 | Rees |
| 5,736,833 A | * | 4/1998 | Farris ......................... 320/163 |
| 5,852,375 A | | 12/1998 | Byrne et al. |
| 5,909,142 A | * | 6/1999 | Kawasaki et al. .......... 327/543 |
| 5,914,626 A | * | 6/1999 | Kim et al. ................... 327/309 |
| 5,933,025 A | | 8/1999 | Nance et al. |
| 5,933,027 A | | 8/1999 | Morris et al. |
| 6,005,413 A | | 12/1999 | Schmitt |
| 6,018,257 A | | 1/2000 | Hung et al. |
| 6,031,394 A | | 2/2000 | Cranford et al. |
| 6,054,888 A | | 4/2000 | Maley |

(List continued on next page.)

FOREIGN PATENT DOCUMENTS

WO     WO 00/38322     6/2000

OTHER PUBLICATIONS

Deng–Yuan Chen, "Design of A Mixed 3.3V and 5V PCI I/O Buffer," *Compass Design Automation*, San Jose, California, U.S.A.

Primary Examiner—Terry D. Cunningham
(74) Attorney, Agent, or Firm—Christie, Parker & Hale, LLP

(57) ABSTRACT

A method of providing bias voltages for input output connections on low voltage integrated circuits. As integrated circuit voltages drop generally so does the external voltages that those circuits can handle. By placing input and output devices, in series, external voltages can be divided between the devices thereby reducing junction voltages seen by internal devices. By using external voltages as part of a biasing scheme for integrated circuit devices, stress created by the differential between external voltages and internal voltages can be minimized. Additionally device wells can be biased so that they are at a potential that is dependent on the external voltages seen by the low voltage integrated circuit.

14 Claims, 23 Drawing Sheets

U.S. PATENT DOCUMENTS

| | | | |
|---|---|---|---|
| 6,078,487 A | * 6/2000 | Partovi et al. | 361/56 |
| 6,081,132 A | 6/2000 | Isbara | |
| 6,081,412 A | 6/2000 | Duncan et al. | |
| 6,097,237 A | * 8/2000 | Singh | 327/389 |
| 6,130,556 A | 10/2000 | Schmitt et al. | |
| 6,140,846 A | 10/2000 | Chan et al. | |
| 6,147,846 A | * 11/2000 | Borg | 361/91.1 |
| 6,160,428 A | * 12/2000 | Pasqualini | 327/142 |
| 6,194,944 B1 | * 2/2001 | Wert | 327/327 |
| 6,351,157 B1 | 2/2002 | Sharpe-Geisler | |
| 6,362,652 B1 | 3/2002 | Oner et al. | |
| 6,388,475 B1 | 5/2002 | Clark et al. | |
| 6,429,716 B1 | 8/2002 | Drapkin et al. | |
| 6,600,346 B1 | 7/2003 | Macaluso | |
| 6,639,772 B2 | * 10/2003 | Chuang et al. | 361/56 |
| 6,738,242 B1 | * 5/2004 | Kwong et al. | 361/56 |

* cited by examiner (ALTERNATELY $V_{DDC}$ OR $V_{DDP}$)

US 6,847,248 B2

SUB-MICRON HIGH INPUT VOLTAGE TOLERANT INPUT OUTPUT (I/O) CIRCUIT WHICH ACCOMMODATES LARGE POWER SUPPLY VARIATIONS

CROSS-REFERENCE TO RELATED APPLICATION(S)

This application claims priority from provisional application No. 60/260,582 entitled "Sub-Micron, high input voltage tolerant I/O circuit" filed Jan. 9, 2001, which is hereby incorporated by reference as though set forth in full.

This application also claims priority from provisional application No. 60/260,580 entitled "Sub-Micron, high input voltage tolerant I/O circuit with power management support" filed Jan. 9, 2001, which is hereby incorporated by reference as though set forth in full.

FIELD OF THE INVENTION

The present invention relates to integrated circuits (ICs), such as interface circuits, that are designed having reduced feature sizes, for example, 0.13 μm. More particularly, the invention relates to ICs that include interfaces (such as input/output (I/O) circuits) that are capable of interfacing with comparatively high-voltage signals from other sources, for example a 3.3 volt IC interfacing with signals from a 5 volt IC, or any other disparate ranges. Moreover, the invention relates to integrated circuits in which the semiconductor devices are biased such that the stress across the gate-oxides and junctions, as well as the leakage currents, are maintained at tolerable levels.

BACKGROUND OF THE INVENTION

The trend in CMOS-based processing technology is to produce integrated circuit (IC) cores having a higher density of semiconductor devices, such as transistors, and faster clock rates than their predecessors. I/O signals, which electrically connect the IC core to external components, are accessed through I/O circuit pads that surround the IC core. The IC core and the I/O circuit pads are generally fabricated from the same processing technology. There is however no requirement that they comprise the same technology and hybrid circuits are known in the art. The inventive concepts herein are applicable to a variety of fabrication technologies.

The performance of the IC cores may generally be improved by shrinking the feature sizes of the semiconductor devices, for example field-effect transistors (FETs). Unfortunately, reducing the IC feature sizes may proportionally decrease the maximum operating voltage that the semiconductor devices within the IC can withstand. For example, an I/O circuit pad, fabricated from a CMOS process having 0.30 micron features, typically withstands a maximum operating voltage of about 3.6 volts. In such a case the maximum operating voltage of the I/O circuit pad is insufficient to drive the external components which have a higher voltage requirement, such as 5 volts. Furthermore, if the IC is interfaced with a greater than the maximum operating voltage, the IC may fail.

One way to attempt to resolve the requirements of circuits with mismatched voltage requirements is to increase the robustness of the fabrication process, for example by increasing the thickness of the gate-oxide layer of the semiconductor devices which comprise the IC circuitry. A thick gate-oxide layer may provide semiconductor devices, such as FETs, with the ability to support a higher voltage requirement. However, this voltage robustness is commonly accompanied by a decreases the performance of the IC, because the thick gate-oxide layer reduces the overall gain of the devices which comprise the IC. Reducing the gain minimizes the benefit which occurs by reducing the feature size.

Other attempts have included increasing the complexity of the CMOS fabrication process so there are multiple sets of devices where each set meets different voltage requirements. Each set of devices requires a different gate-oxide. Each additional gate-oxide requires a separate mask. The resulting hybrid process may significantly increase the manufacturing costs of the IC.

One way to avoid the drawbacks of the aforementioned processing-based solutions is to use a "level-shift" chip as an external component. The IC core and the I/O circuits are fabricated from the same process. The "level-shift chip" may be fabricated from a process that supports the discrete voltage requirement by stepping up the core output signals to support the discrete voltage range and stepping down the external drive signals to support the IC core voltage range. Such a level-shift chip can be a waste of much needed space on a crowded printed circuit board and may degrade performance.

An I/O circuit that transforms voltages between different voltage levels without degrading the overall performance of the integrated circuit and maximizing use of space on the printed circuit board or multi-chip substrate may be beneficial. It would be a further benefit if such an I/O circuit could use voltages presented at the I/O circuit in order to provide such protective biasing.

Commonly an I/O power supply may vary +/−10% and may vary significantly more during transient conditions. An I/O power supply may even go to zero at power off. When the I/O power supply varies, circuits may have higher stress on the gate-oxides of the devices in the I/O circuit, such stresses may not be desirable in many process technologies. It may be desirable to provide bias voltages to various devices in the I/O circuit such that the device gate-oxide is protected from high-voltages under various conditions of operation even when the power-supply voltage varies by a large amount.

Embodiments of the present invention may be optimized, for example where 5 volt input tolerance is required, even when the power supplies are varying by a significant amount, which may range from a maximum value to zero.

Embodiments of the present invention are illustrated in an optimized form for I/O circuits where a 5 volt +/−10% input tolerance is required for normal operating range. Additionally the inventive concepts herein are described in terms of CMOS (Complimentary Metal Oxide Semiconductor) integrated circuits. Those skilled in the art will readily appreciate the fact that techniques described with respect to CMOS ICs are readily applicable to any circuits having disparate power supply and/or drive signal requirements for different portions of the circuitry. The CMOS example chosen is one likely to be familiar to those skilled in the art. There is, however, no intent to limit the inventive concepts to CMOS ICs as the techniques are equally applicable to a wide variety of integrated circuit fabrication techniques.

SUMMARY OF EMBODIMENTS OF THE INVENTION

An exemplary embodiment of the invention includes an integrated circuit having a four device input output circuit in a push pull configuration. Two of the devices, termed upper devices, comprise PMOS (P-Channel Metal Oxide Semiconductor) devices and two of the devices, termed lower devices, comprise NMOS (N-channel Metal Oxide Semiconductor) devices. The devices are biased to reduce hazardous voltages across device junctions and to eliminate the magnitude of the voltage being passed on to the core circuitry. The biases are derived from the input output state of the circuit and the voltage presented to the I/O circuit connection ($V_{PAD}$), and the variation of supply voltages. Additionally PMOS device well bias voltage is developed based on $V_{PAD}$ and power supply voltage.

BRIEF DESCRIPTION OF THE DRAWINGS

Other features and advantages of the invention will become apparent from a description of the following figures, in which like numbers refer to similar items throughout.

DETAILED DESCRIPTION OF EMBODIMENTS OF THE INVENTION

Figure 1:
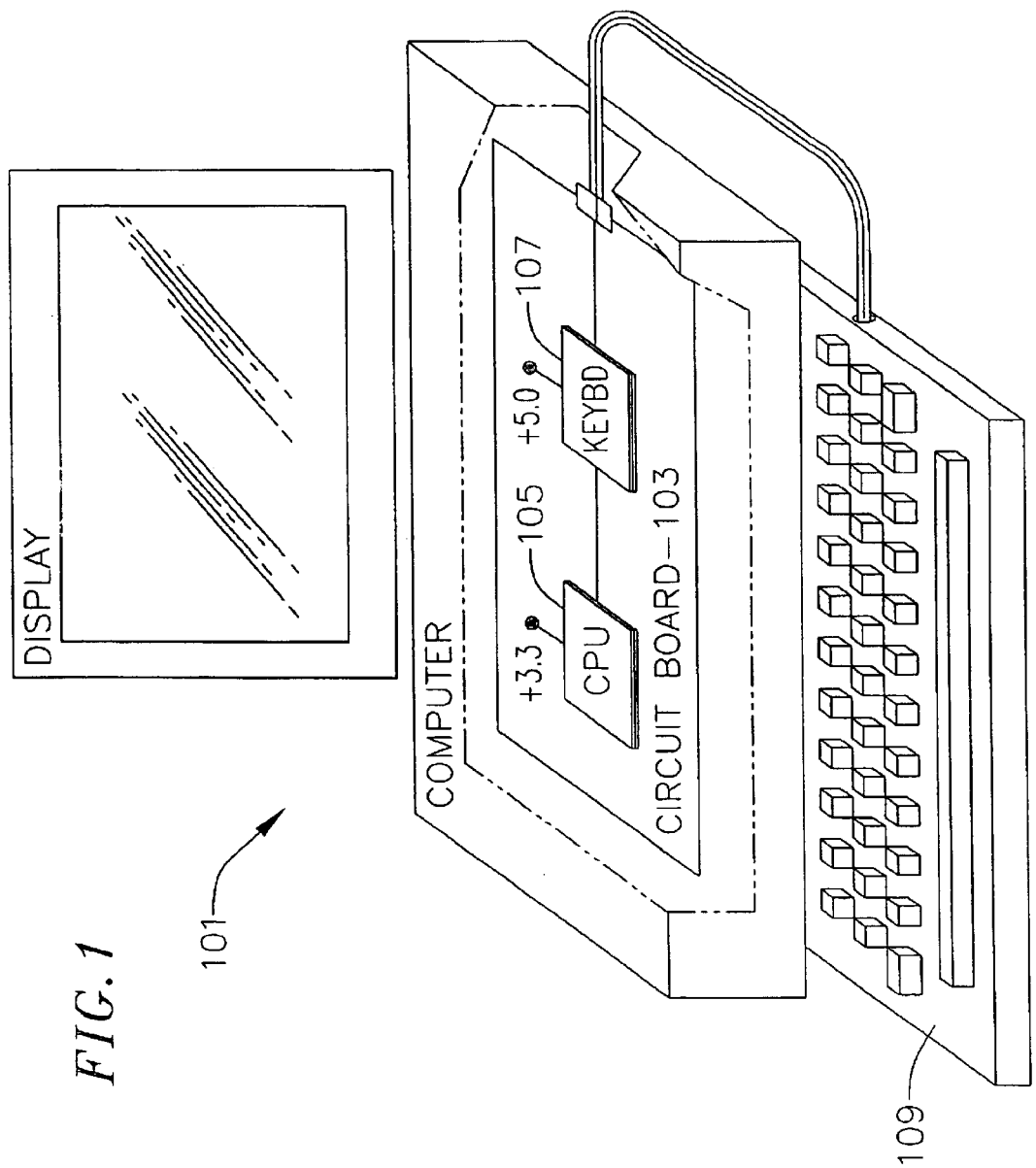
FIG. 1 is a graphic illustration of an exemplary environment in which embodiments of the invention may be utilized.

FIG. 1 is a graphic illustration of an exemplary environment in which embodiments of the invention may be utilized. In FIG. 1 a personal computer system is represented generally at 101. Within the computer system is circuit board 103 on which a CPU integrated circuit chip 105 is mounted. The CPU is a type which uses 3.3 volts as its supply voltage. A keyboard interface integrated circuit chip 107 is also mounted on circuit board 103. The keyboard interface integrated circuit is one having a supply voltage of 5.0 volts. The CPU 105 is coupled to the Keyboard chip 107. The CPU 105 may be of a type which contains integrated devices that may be damaged by interfacing with a device having a higher supply voltage. Because of the disparity in supply voltages that may exist in such situations an output circuit which can compensate for the higher interface voltages may be particularly useful.

Figure 2:
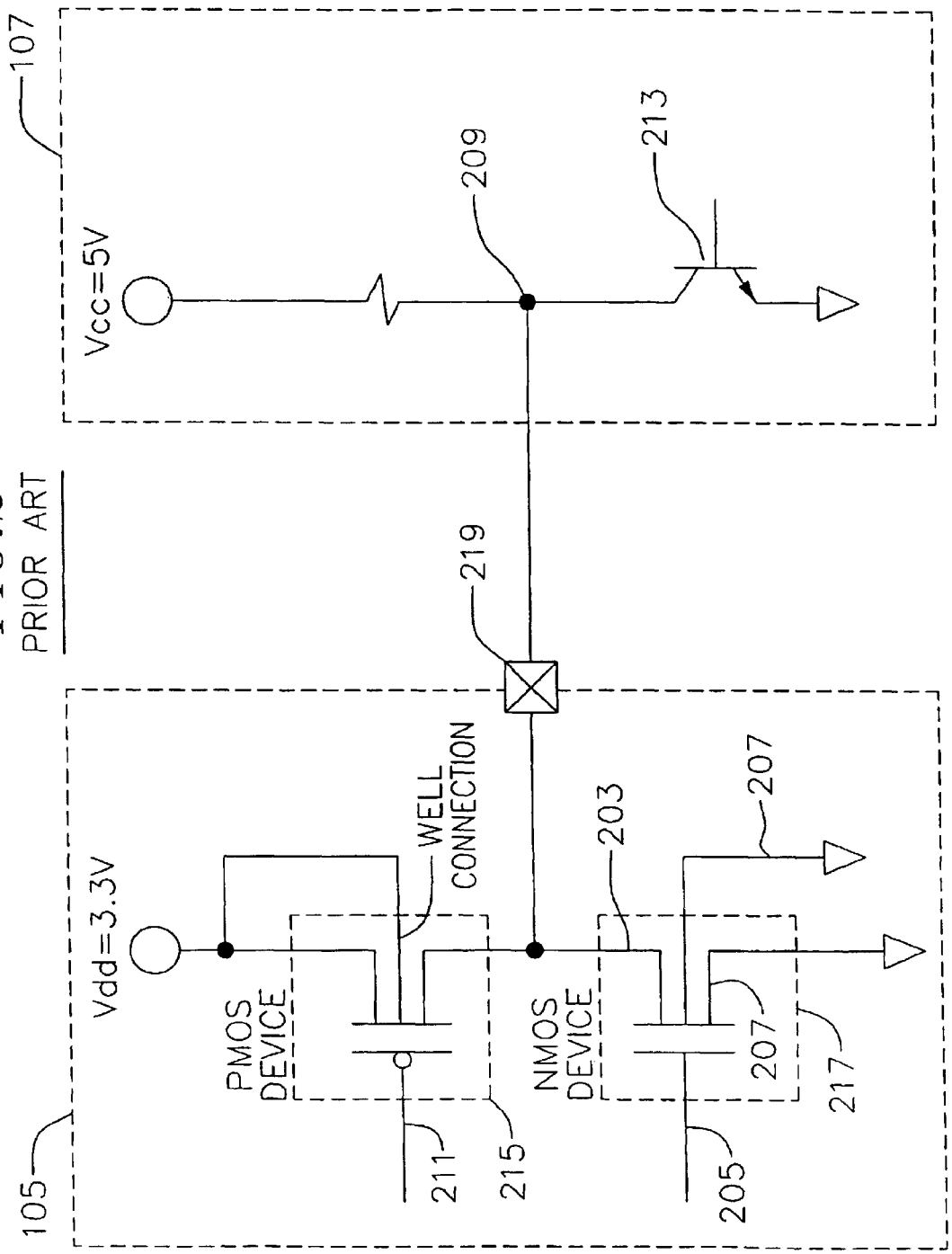
FIG. 2 is a graphical illustration of a prior art input output circuit and connection to a circuit having a different power supply voltage.

FIG. 2 is a graphical illustration of a prior art input output circuit and connection. A common input output circuit comprises a pull up device, such as PMOS (P-channel Metal Oxide Semiconductor) device 215 and a pull down device, such as NMOS (N-channel Metal Oxide Semiconductor) device 217, such as illustrated in FIG. 2. Devices 215 and 217 are coupled together at an input/output (I/O) pad 219. The substrate for the NMOS device is commonly coupled to ground potential, e.g. as shown at 221. The substrate for the NMOS device is typically a substrate which is common for the entire integrated circuit chip on which it resides. PMOS devices are commonly fabricated in their own isolated well.

In deep submicron fabrication, the component integrated devices can tolerate only limited differential voltages across their junctions. Commonly the voltage which can be tolerated across the junctions is on the order of 2.5 Volts.

In the Illustration of FIG. 2 pad 219 interfaces to a volt circuit, and hence the pad may see voltages in the neighborhood of 5.5 volts. A 5 volt signal applied to pad 219 may stress devices within the chip 105. For example if gate 205 of device 217 is at a zero volt potential then the voltage across the 205-203 gate-oxide may exceed 5 volts, thereby stressing device 217. For this reason more than one device may be used to divide the voltages in pull up and pull down I/O circuits.

Figure 3:
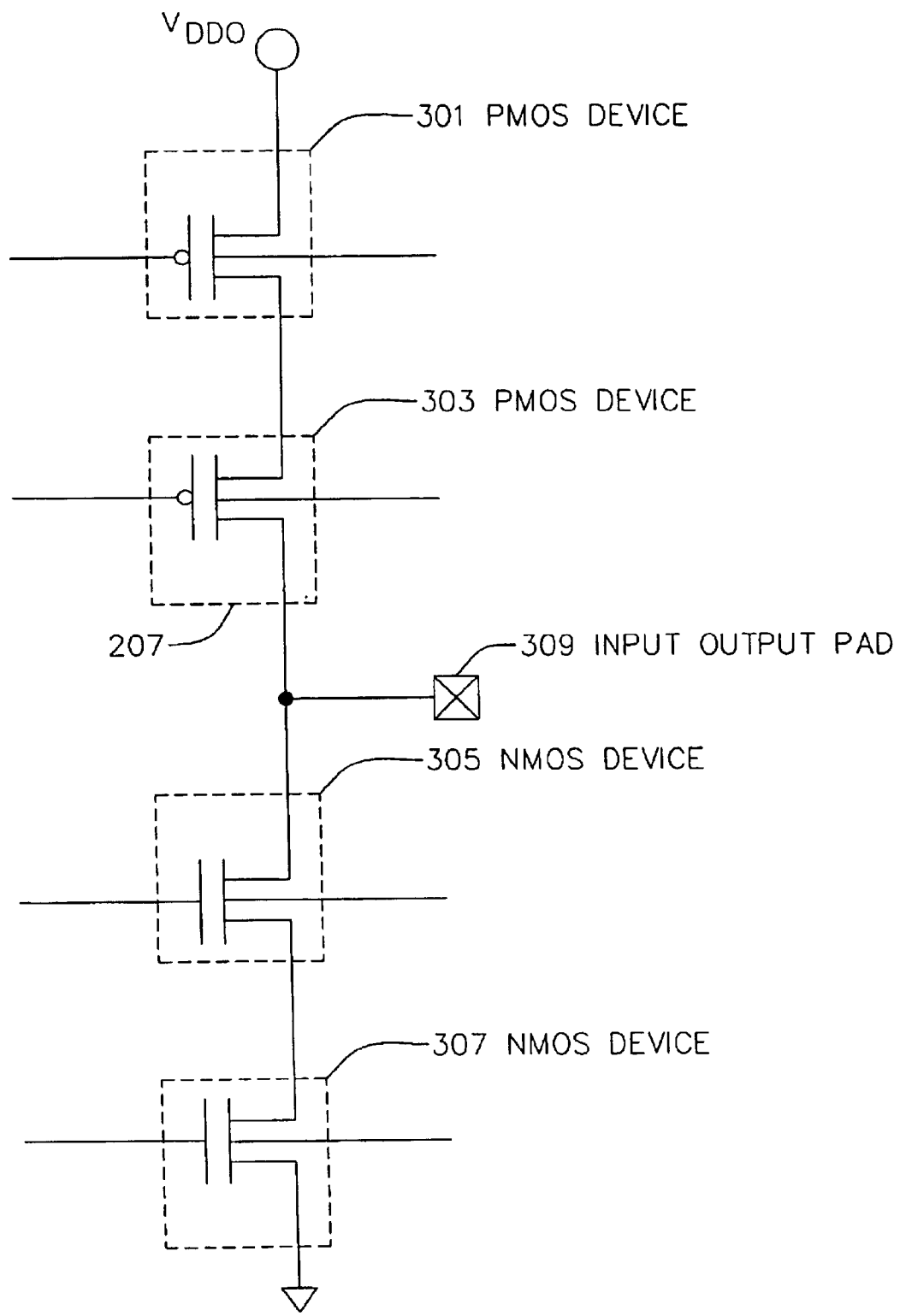
FIG. 3 is a schematic of a portion of a MOS (Metal Oxide Semiconductor) input output circuit in which single push and pull output devices have been replaced by two devices each.

FIG. 3 is a schematic of a portion of a MOS (Metal Oxide Semiconductor) input output circuit in which each push pull output device illustrated in FIG. 2 has been replaced by two devices. That is output device 215 has been replaced by devices 301 and 303 and device 217 has been replaced by devices 305 and 307. By replacing devices 215 and 217 by two devices each, the output voltage appearing at pad 309 may be safely divided over the two upper (301 and 303) and the two lower (305 and 307) I/O devices. The middle NMOS device 303 and the middle PMOS device 305 have their gates biased to intermediate potentials to avoid excessive voltages under various pad voltages 309.

Figure 4:
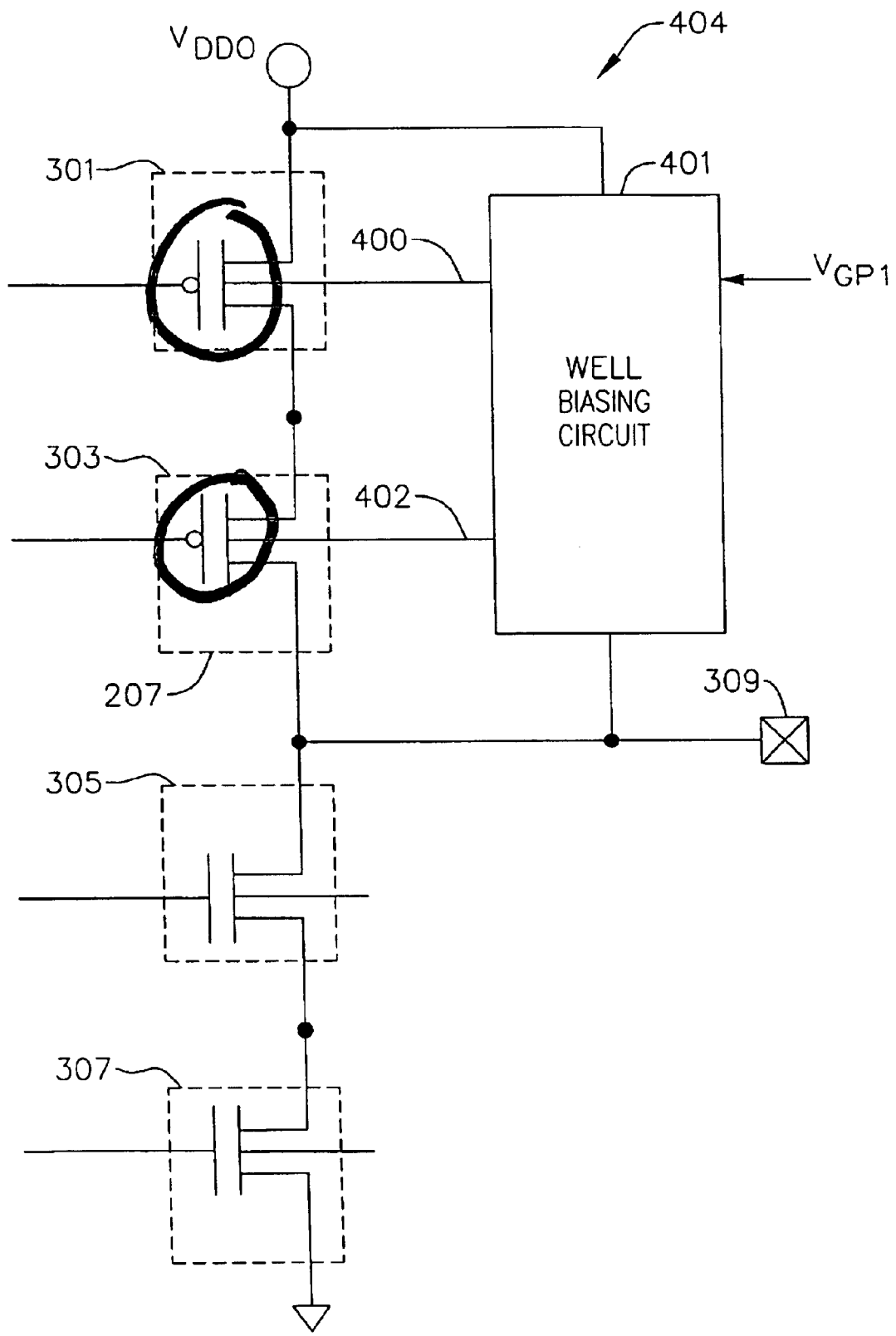
FIG. 4 is input output circuit, including a well biasing circuit, according to an embodiment of the invention.

FIG. 4 is input output circuit 404, including a well biasing circuit, according to an embodiment of the invention.

Figure 7:
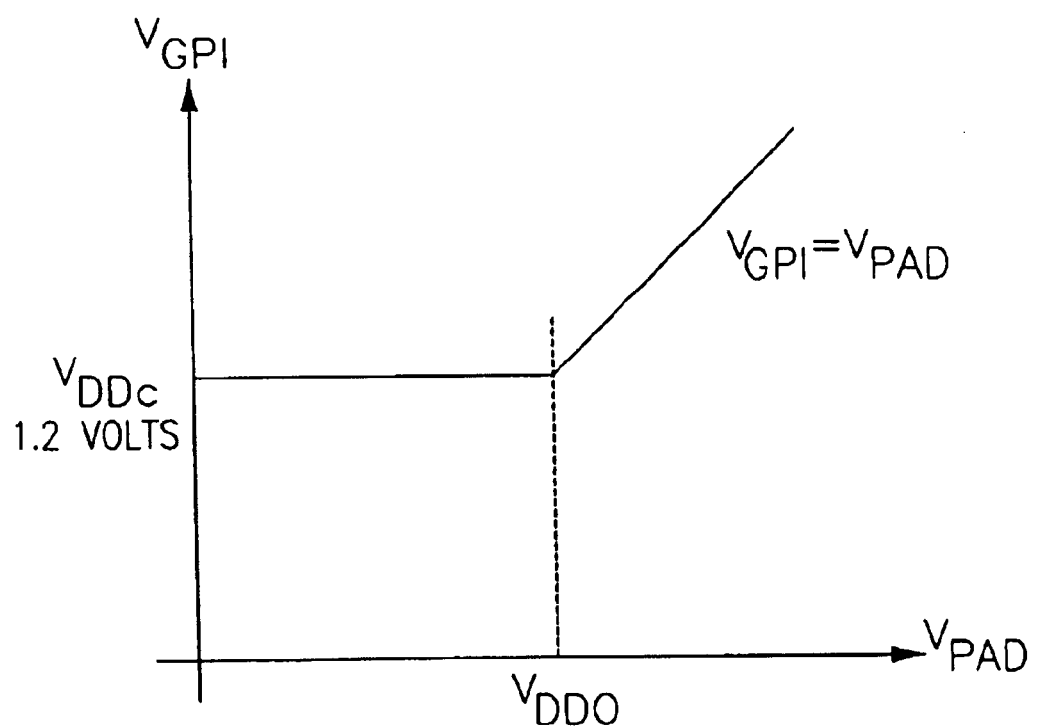
FIG. 7 is a graphical representation of $V_{GP1}$ bias voltage as a function of pad voltage ($V_{PAD}$)

Devices 301 and 303 are fabricated in wells, illustrated schematically as 400 and 402, which are essentially at a floating potential. Because devices in wells at floating potential can have problems, such as device latch up, wells are commonly connected to a known bias voltage. The wells of devices 301 and 303 are tied to the highest circuit potential available using well biasing circuit 401. The inputs to the well biasing circuit are the pad voltage present on input output pad 309, $V_{DDO}$ and voltage $V_{GP1}$, the characteristics of which are illustrated in FIG. 7.

During the operation of I/O circuit 404 in an output mode (i.e. when pad 309 is in an output mode), wells 400 and 402 are tied to $V_{DDO}$. However, when pad 309 is in an input mode, the well voltage depends upon the pad voltage. In the output mode $V_{well}=V_{DDO}$.

When I/O circuit 404 is in an input mode (when pad 309 is in an input mode), $V_{well}$ depends on both the input (Pad) voltage $V_{PAD}$ as well as $V_{DDO}$. If $V_{PAD}$ is less than $V_{DDO}$, when input output circuit 404 in the input or tristate mode, then $V_{well}=V_{DDO}$. If $V_{PAD}$ is greater than $V_{DDO}$, when input output circuit 404 in the input or tristate mode, then $V_{well}=V_{PAD}$. A graph of this relationship is illustrated in FIG. 5.

Figure 5:
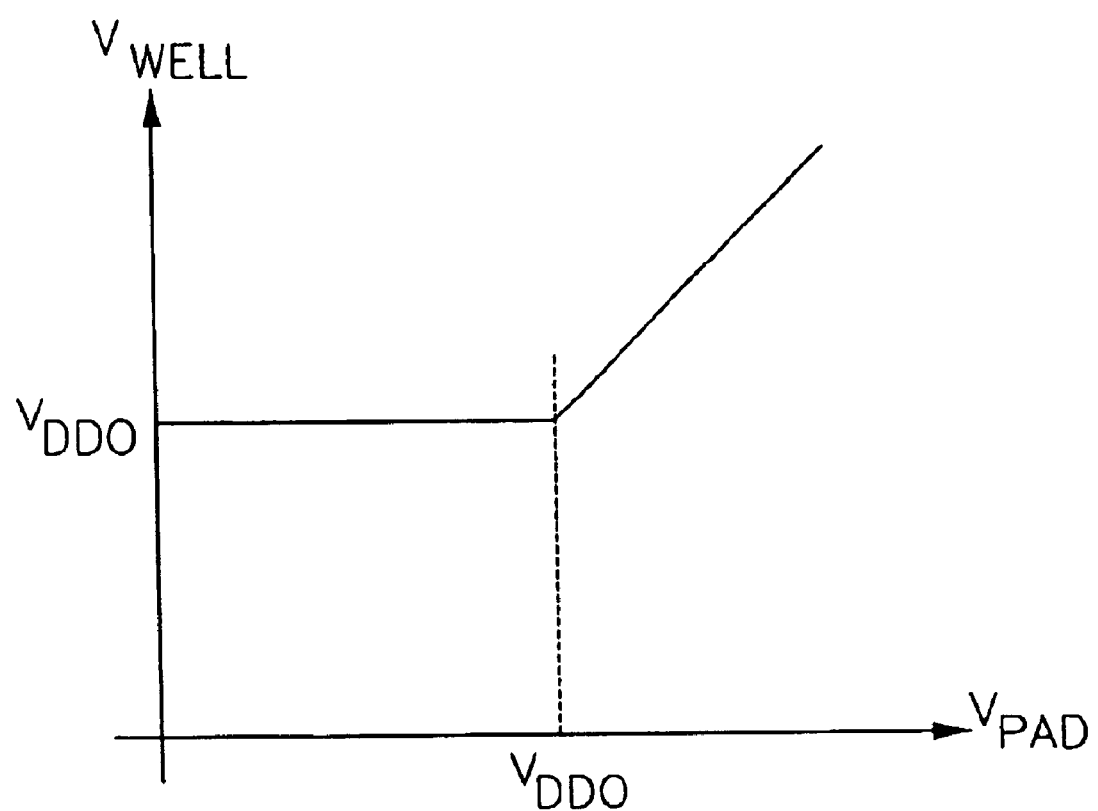
FIG. 5 is a graph illustrating the relationship between well voltage and pad voltage for the input (or a tristate) mode, according to an embodiment of the invention.

FIG. 5 is a graph illustrating the relationship between well voltage and pad voltage for the I/O circuit in an input (or a tristate) condition. As can be seen from the graph, if the pad voltage is less than $V_{DDO}$ then the well voltage is equal to $V_{DDO}$. If the pad voltage is greater than $V_{DDO}$ then the well voltage is equal to the pad voltage. The well bias can thereby be changed according to changing circuit conditions.

Figure 6:
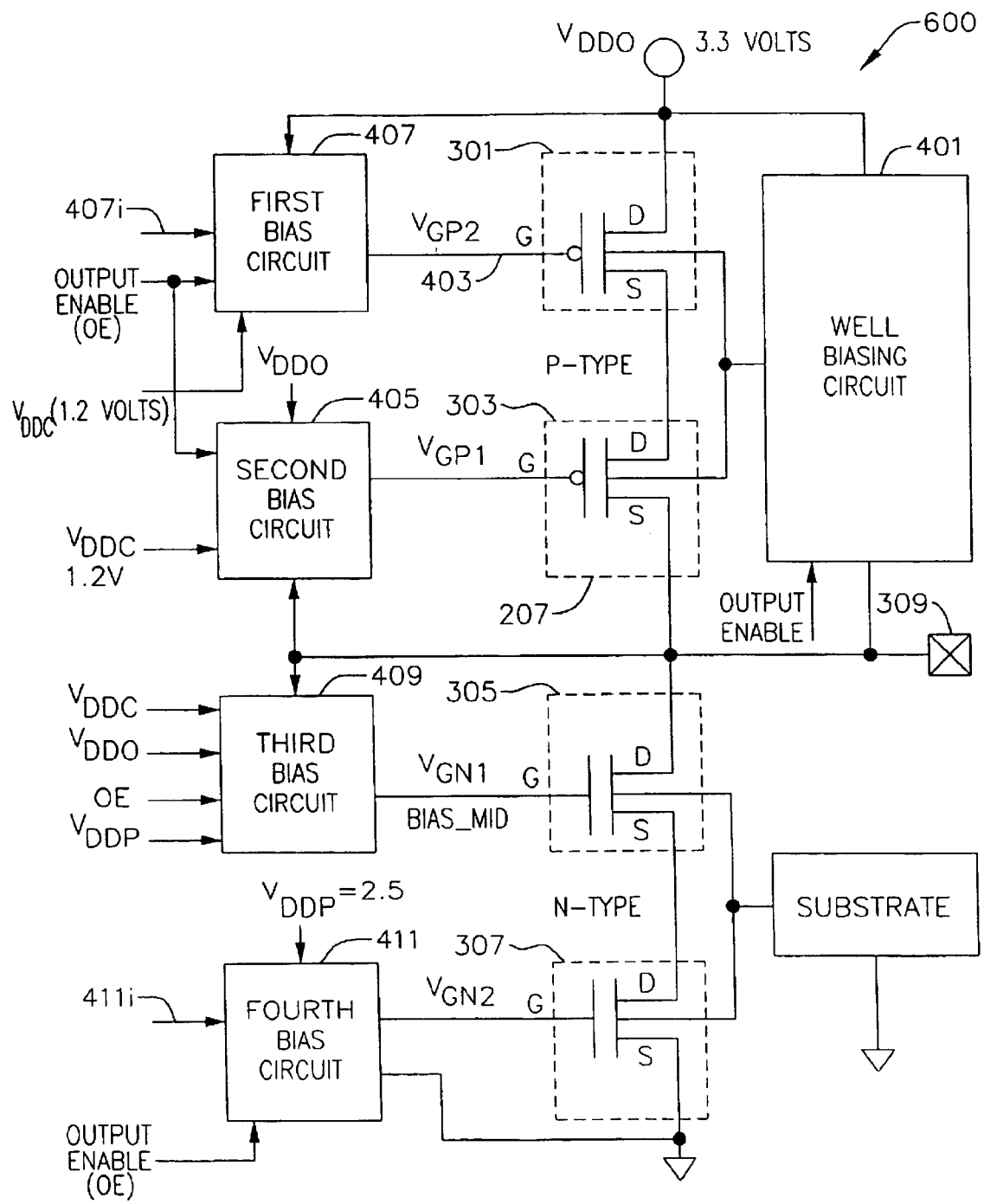
FIG. 6 is a block diagram of I/O circuitry biasing according to an embodiment of the invention.

FIG. 6 is a block diagram of I/O circuitry 600 biasing according to an embodiment of the invention.

When I/O circuitry 600 is in the input mode, first bias circuit 407 couples the gate 403 of device 301 to $V_{DDO}$. In the output mode, device 301 is controlled by an input from first bias circuit 407 according to whether $V_{PAD}$ needs to be a high or low value.

In the input mode second bias circuit 405 provides gate voltage $V_{GP1}$ to the gate of output device 303. The gate voltage $V_{GP1}$ provided to the gate of output device 303 varies from an intermediate power supply voltage, such as $V_{DDC}=1.2$ volts, and the pad voltage presented to the circuit at input output pad 309. Such biasing prevents device 303 from being damaged due to a voltage potential across its junctions.

FIG. 7 is a graphical representation of $V_{GP1}$ bias voltage as a function of pad voltage ($V_{PAD}$) If $V_{PAD}$ is less than $V_{DDO}$ then $V_{GP1}$ provided to the gate of output device 303 is equal to the intermediate supply voltage $V_{DDC}$. If $V_{PAD}$ is greater than $V_{DDO}$ then $V_{GP1}$ provided to the gate of output device 303 is equal to $V_{PAD}$. In such a manner the voltage between the gate of device 303 and pad 309 can be kept in a safe range to prevent damage to the junction.

To summarize the operation of the circuit of FIG. 6, when the circuit 600 is in an output mode: The well biasing circuit 401 ties the wells of devices 301 and 303 to $V_{DDO}$. The gate of the lower PMOS device 307 is tied to an intermediate voltage, such as $V_{DDC}=1.2$ Volts. The gate of upper NMOS device 305 is tied to an intermediate voltage, such as $V_{DDP}=2.5$ Volts.

When the circuit 600 is in not in output mode, that is in the tri-state or input mode then upper PMOS device 301 and lower NMOS device 307 are turned off and devices 303 and 305 are turned on to divide the voltages of the output circuit.

The gate voltage of the upper NMOS device 305 is controlled by third bias circuit 409. Third bias circuit 409, when in an input or tristate mode, will increase the Bias_Mid voltage when the pad voltage increases beyond a certain threshold, for example $V_{DDP}=2.5$ Volts.

Fourth bias circuit 411 works in a similar fashion to first bias circuit 407. Both bias circuits 407 and 411 work in a digital mode, either providing a first or second voltage depending on the required I/O pad 309 output voltage. In a first mode of operation, first bias circuit 407 switches between a first voltage $V_{DDO}$ and a second lower voltage $V_{DDC}$ gate bias circuit 411 switches between providing $V_{DDP}$ and ground potential at the same time to the gate of device 307.

Figure 8:
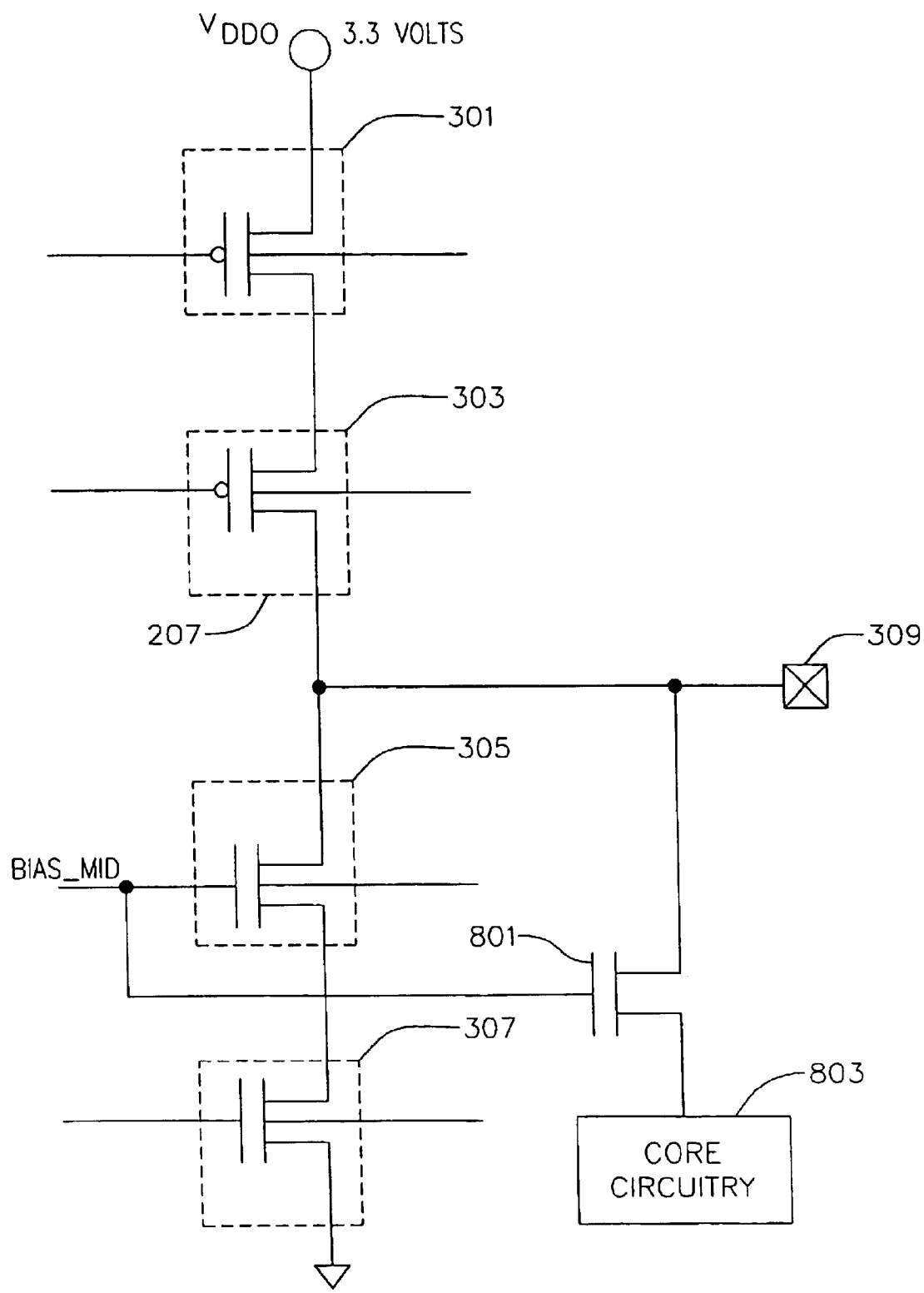
FIG. 8 is a graphical illustration of a circuit configuration used to provide the pad voltage to integrated circuit core circuitry.

FIG. 8 is a graphical illustration of a circuit configuration used to provide the pad voltage to the core circuitry. The $V_{PAD}$ input is coupled to the core circuitry 803 through an NMOS device 801. The gate of NMOS device 801 accepts Bias_Mid as its control voltage. Such an arrangement protects the gate source voltage of device 801 and also prevents large voltages from the input from being coupled into the core circuitry when it is in the input, (tristate) or output conditions.

One facet of the I/O system comprising devices 301, 303, 305 and 307 is that any number of such devices may be added in parallel, in order to provide any level of drive signals needed.

Figure 9A:
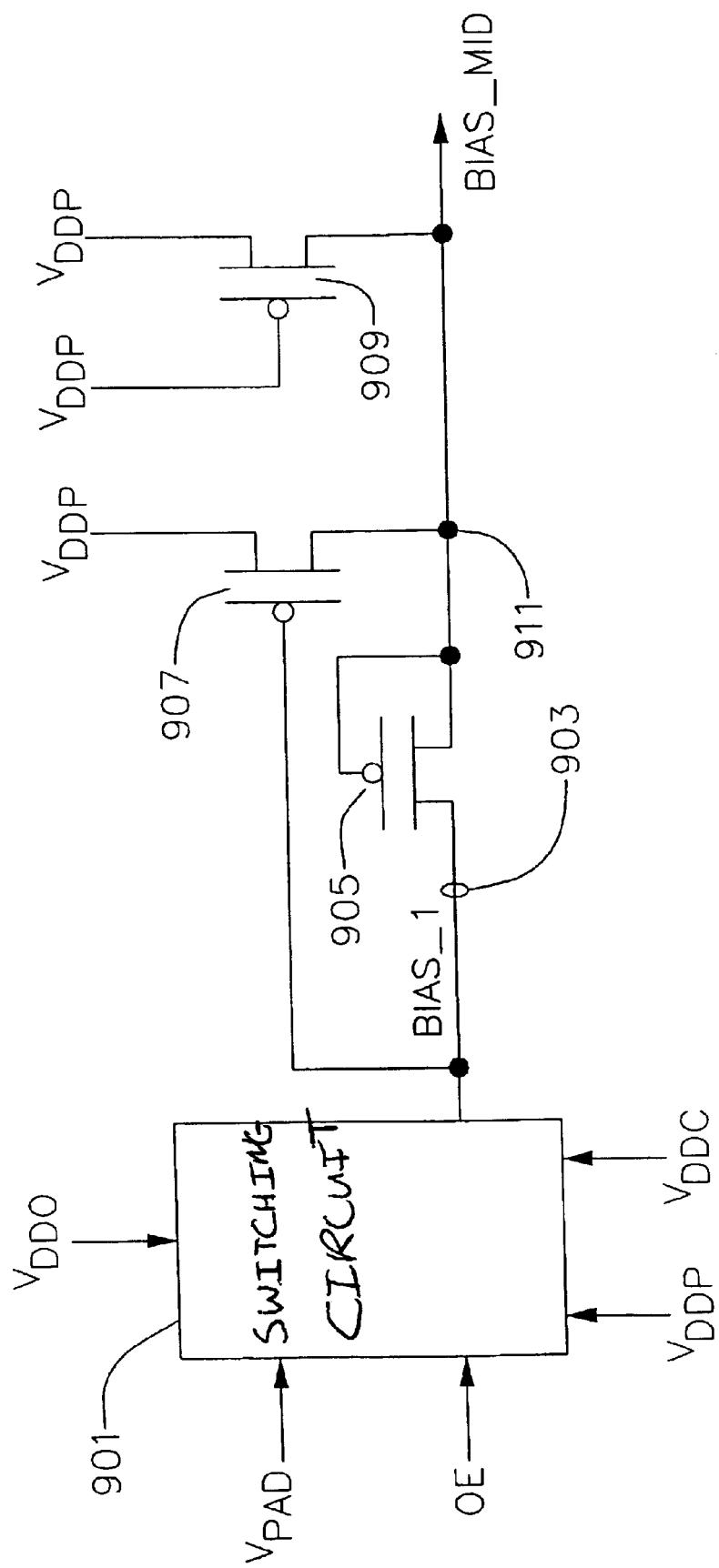
FIG. 9A is a schematic diagram of an embodiment to generate a Bias_Mid voltage, according to an embodiment of the invention.

FIG. 9A is a schematic diagram illustrating how Bias_Mid voltage is generated. Block 901 is a switching circuit that switches its Bias_1 output between voltages VDDO (3.3 Volts nominally in the present embodiment) and VDDC (1.2 Volts nominally in the present embodiment). Device 905 is a PMOS device as are devices 907 and 909. Device 907 turns on when the output is enabled or the $V_{PAD}$ is low. When device 907 is turned on, Bias_Mid is coupled to $V_{DDP}$. When output is not enabled i.e. the pad is in the tri-state (input only) mode and $V_{PAD}$ is high, then bias_1= $V_{DDO}$ and device 905 charges point 911 to bias_1–$V_{TP}$, where $V_{TP}$ is the threshold of device 905, and accordingly is the voltage dropped across device 905. If Bias_Mid>$V_{DDP}$+$V_{TP}$ then device 909 will drain current from node 911 such that $V_{DDP}$+$V_{TP}$ is the maximum value for Bias_Mid. Bias_Mid is always between $V_{DDP}$+$V_{TP}$ and $V_{DDO}$–$V_{TP}$ whether $V_{DDP}$+$V_{TP}$ or $V_{DDO}$–$V_{TP}$ is larger. A typical $V_{TP}$ is 0.5 volts. The actual value of Bias_Mid will be determined by the relative sizes of devices 907 and 909.

Figure 9B:
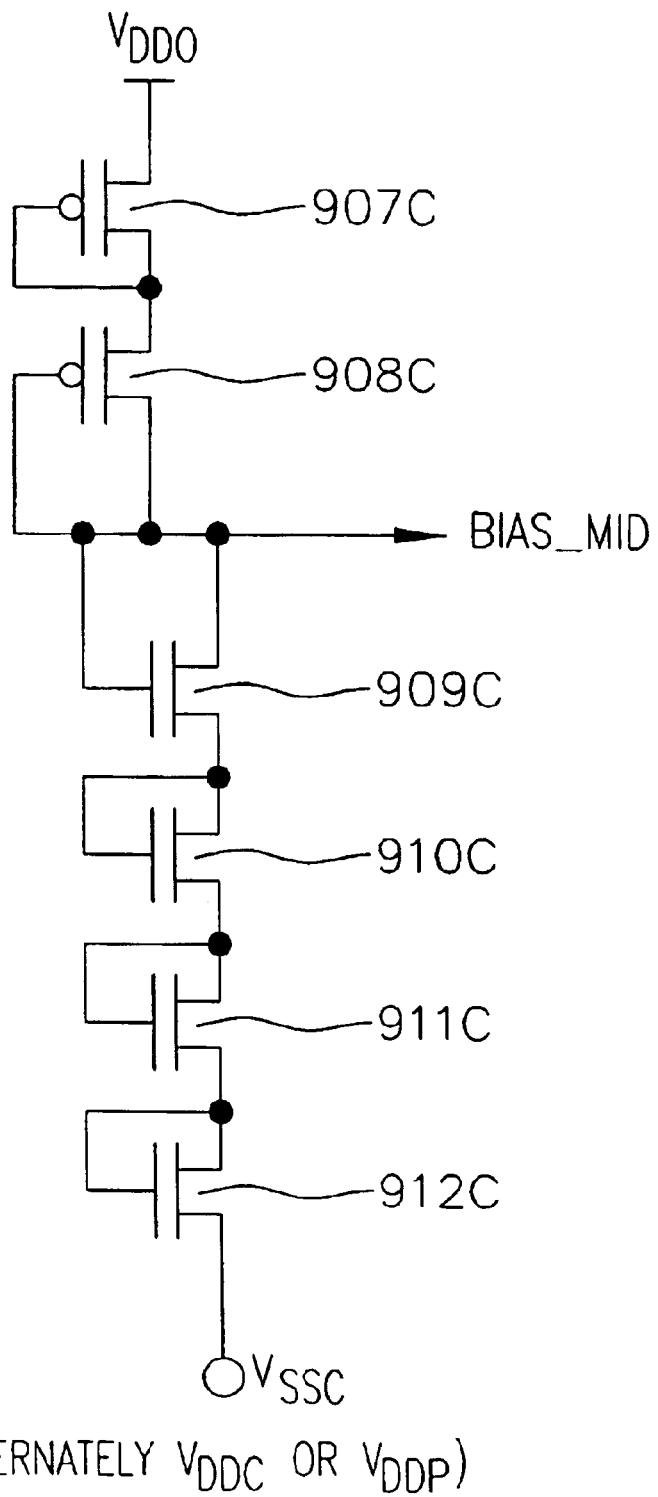
FIG. 9B is a schematic diagram of an alternate embodiment to generate a Bias_Mid voltage, according to an embodiment of the invention.

FIG. 9B is a schematic diagram of another embodiment for generation of Bias_Mid voltage. In FIG. 9B Bias_Mid is always less than $V_{SSC}$+n$V_{Tn}$ and greater than $V_{DDO}$–k$V_{Tp}$, where n$V_{Tn}$ is an offset voltage due to device thresholds, for example devices 909c, 910c, 911c and 912c and k$V_{Tp}$ is also an offset voltage due to device thresholds, for example devices 907c and 908c. Where n and k are integers dependent on the number of devices employed.

Figure 10:
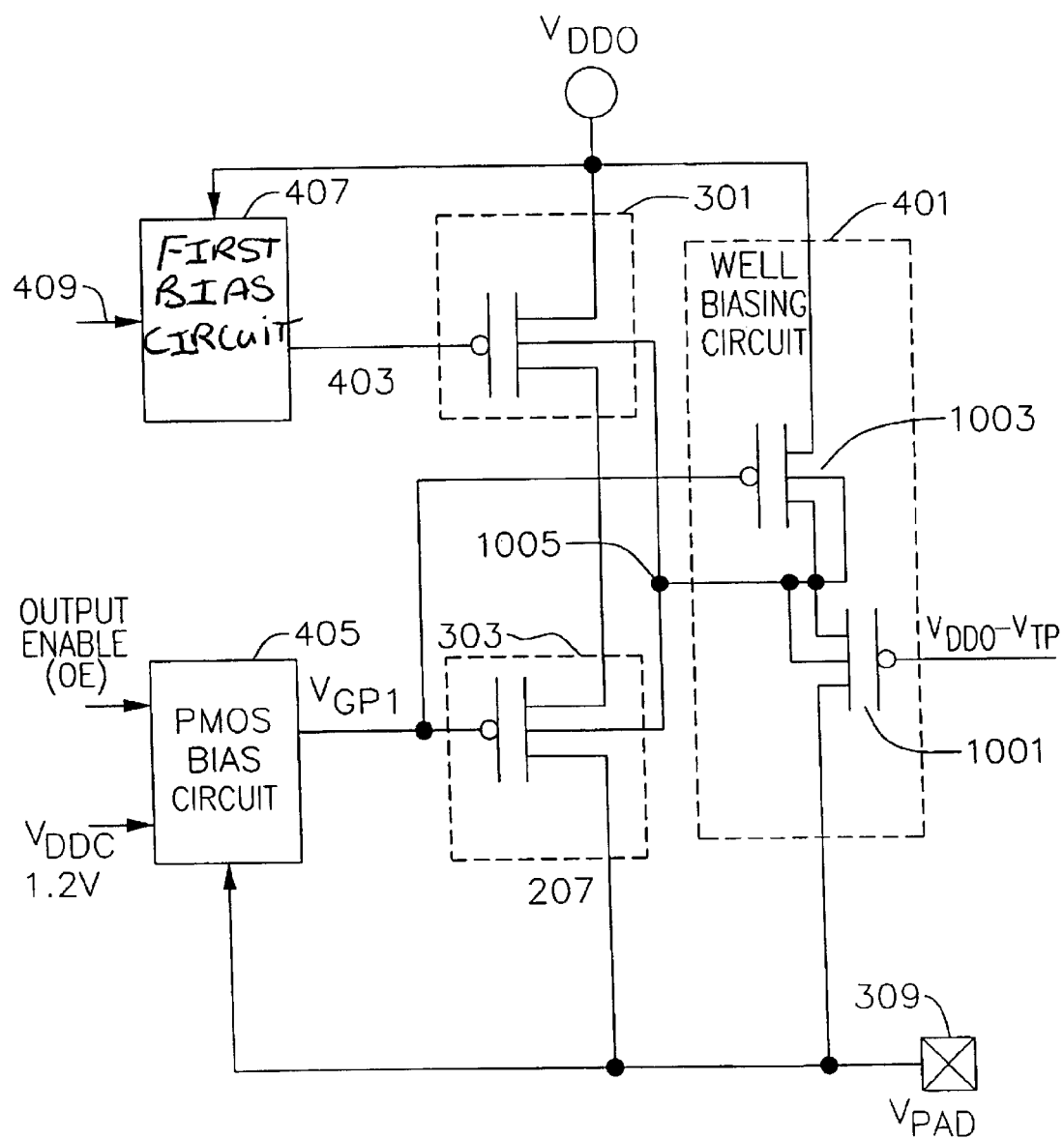
FIG. 10 is a schematic diagram of an exemplary well biasing circuit, according to an embodiment of the invention.

FIG. 10 is a schematic diagram of an exemplary well biasing circuit, according to an embodiment of the invention. Device 1001, when turned on, couples pad 309 to well 1005. Device 1003, when turned on, couples $V_{DDO}$ to the well 1005. When $V_{PAD}$ is less than $V_{DDO}$ the gate source of device 1001 is less than the threshold voltage of device 1001, and device 1001 is turned off. When $V_{GP1}$ is low (e.g 1.2 Volts) then device 1003 conducts, thereby coupling well 1005 to $V_{DDO}$. When $V_{PAD}$ is equal to $V_{DDO}$ or greater then device 1001 will begin to turn on, thereby coupling the well 1005 to $V_{PAD}$.

Figure 11A:
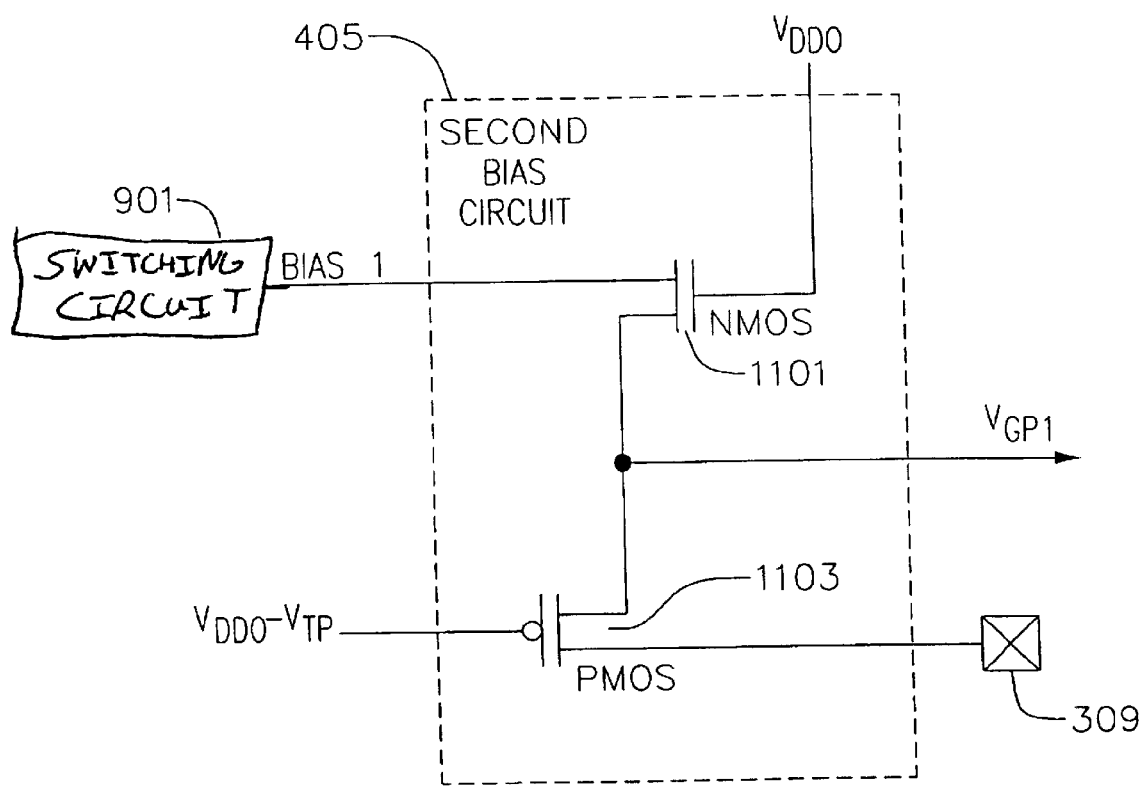
FIG. 11A is a schematic diagram of a circuit used to generate $V_{GP1}$.

FIG. 11A is a schematic diagram of a circuit used to generate $V_{GP1}$. Bias_1 switches between $V_{DDO}$ (3.3 volts) and VDDC (1.2 volts). Device 1101 couples Bias_1 to $V_{GP1}$. When bias__1 is 3.3 volts device 1101 is off and when bias__1 is 1.2 Volts then $V_{GP1}$ is tied to 1.2 Volts. When the $V_{PAD}$ at 309 is greater than $V_{DDO}$ device 1103 begins to conduct, because the gate of device 1103 is tied to $V_{DDO}-V_{TP}$, and $V_{GP1}$ is thereby coupled to $V_{PAD}$.

Figure 11B:
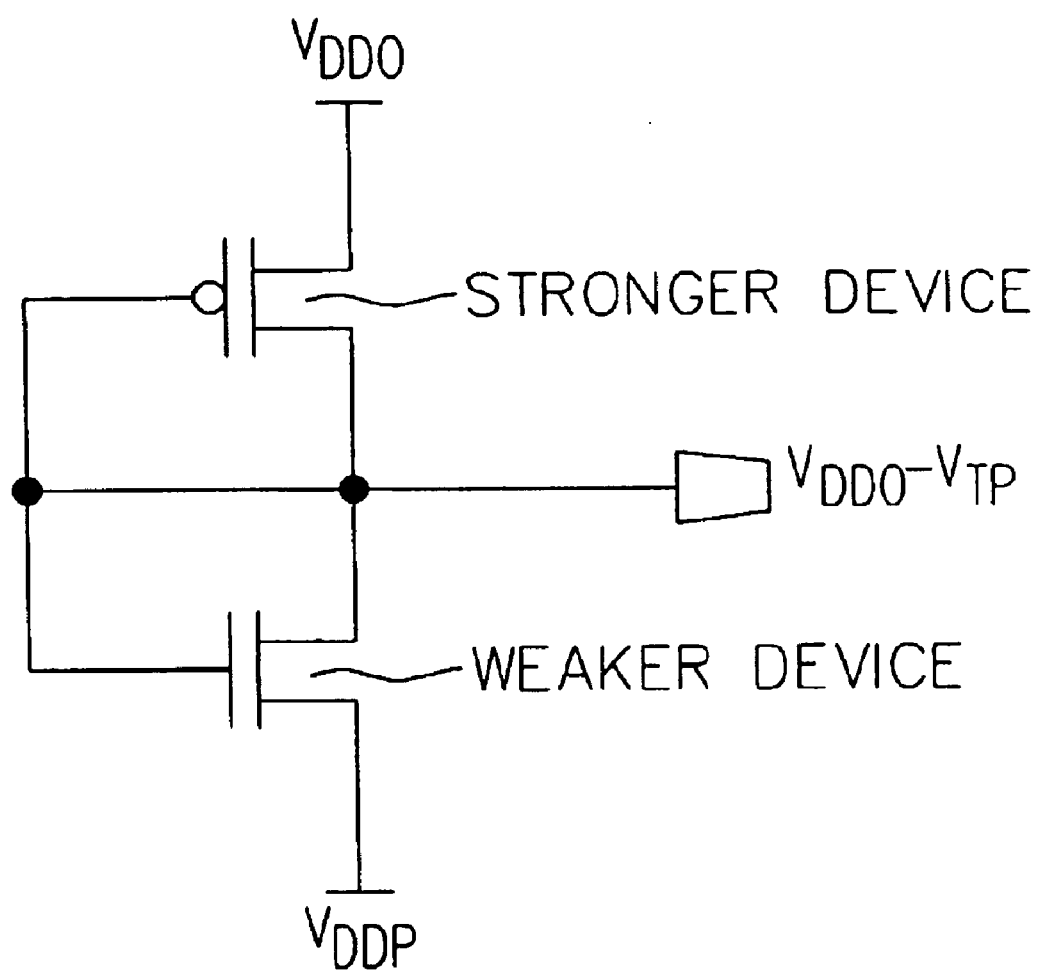
FIG. 11B is a schematic diagram illustration of the generation of the $V_{DDO}-V_{TP}$ voltage depicted in FIG. 11A.

FIG. 11B shows a circuit which may be used to generate $V_{DDO}-V_{TP}$. The strong upper PMOS device changes the node 1150 to $V_{DDO}-V_{TP}$. In addition to the problems that may be caused when a lower supply voltage chip is interfaced with a higher voltage chip there are "power on stress" problems, which may be caused when circuitry is turned on and the supplies that provide protective biases are not yet up to their full voltage. In such a case a voltage present at an I/O pad may stress devices which are coupled to that I/O pad.

Figure 11C:
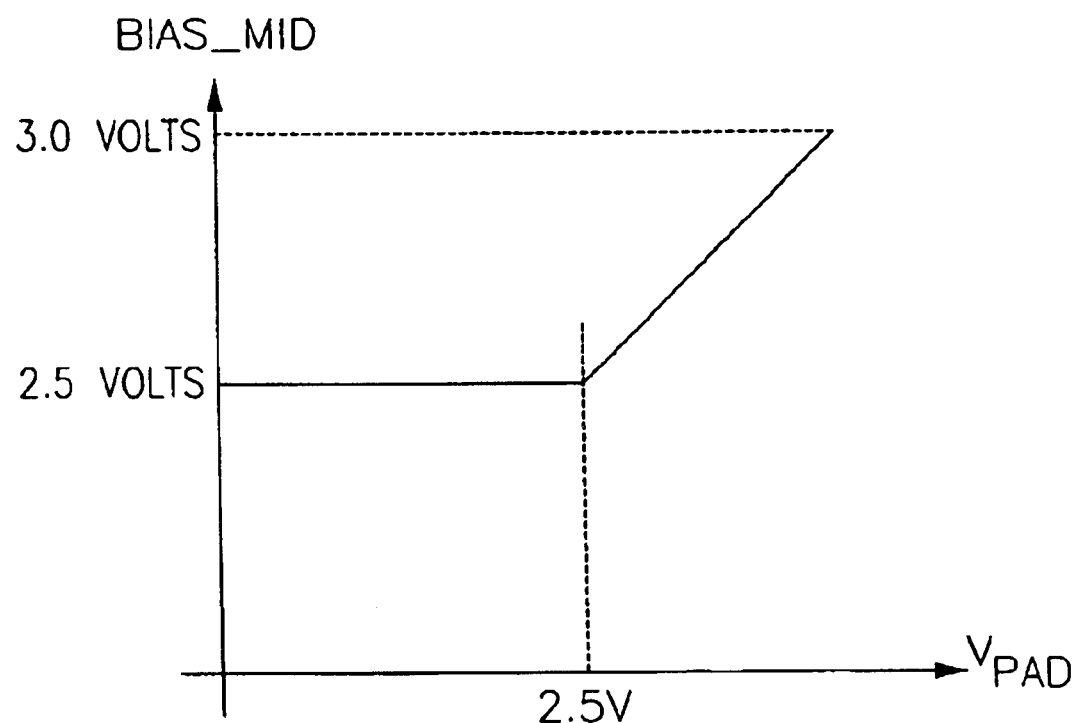
FIG. 11C is a graph illustrating the relationship between Bias_Mid and $V_{PAD}$.

FIG. 11C is a graph illustrating the relationship between Bias__Mid and $V_{PAD}$. Bias__Mid is set at 2.5 volts, and remains at 2.5 volts until $V_{PAD}$ increases beyond 2.5 volts. Thereafter Bias__Mid tracks voltage increases at $V_{PAD}$ and becomes equal to a higher voltage when $V_{PAD}$ increases beyond a certain value.

Figure 11D:
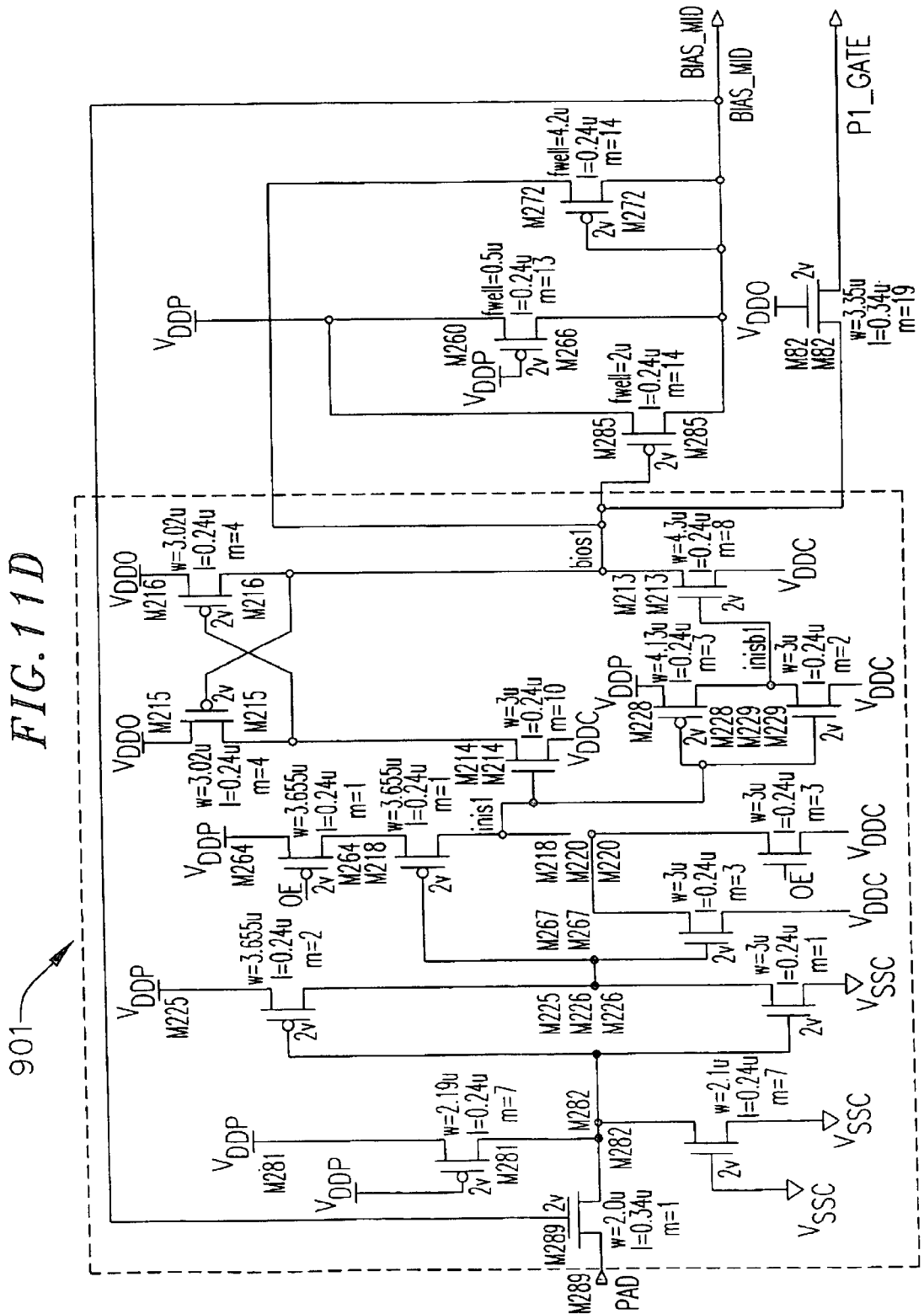
FIG. 11D is a schematic diagram depicting an exemplary illustration of a transistor implementation of block 901.

FIG. 11D is a schematic diagram depicting an exemplary illustration of a transistor implementation of block 901.

Figure 12A:
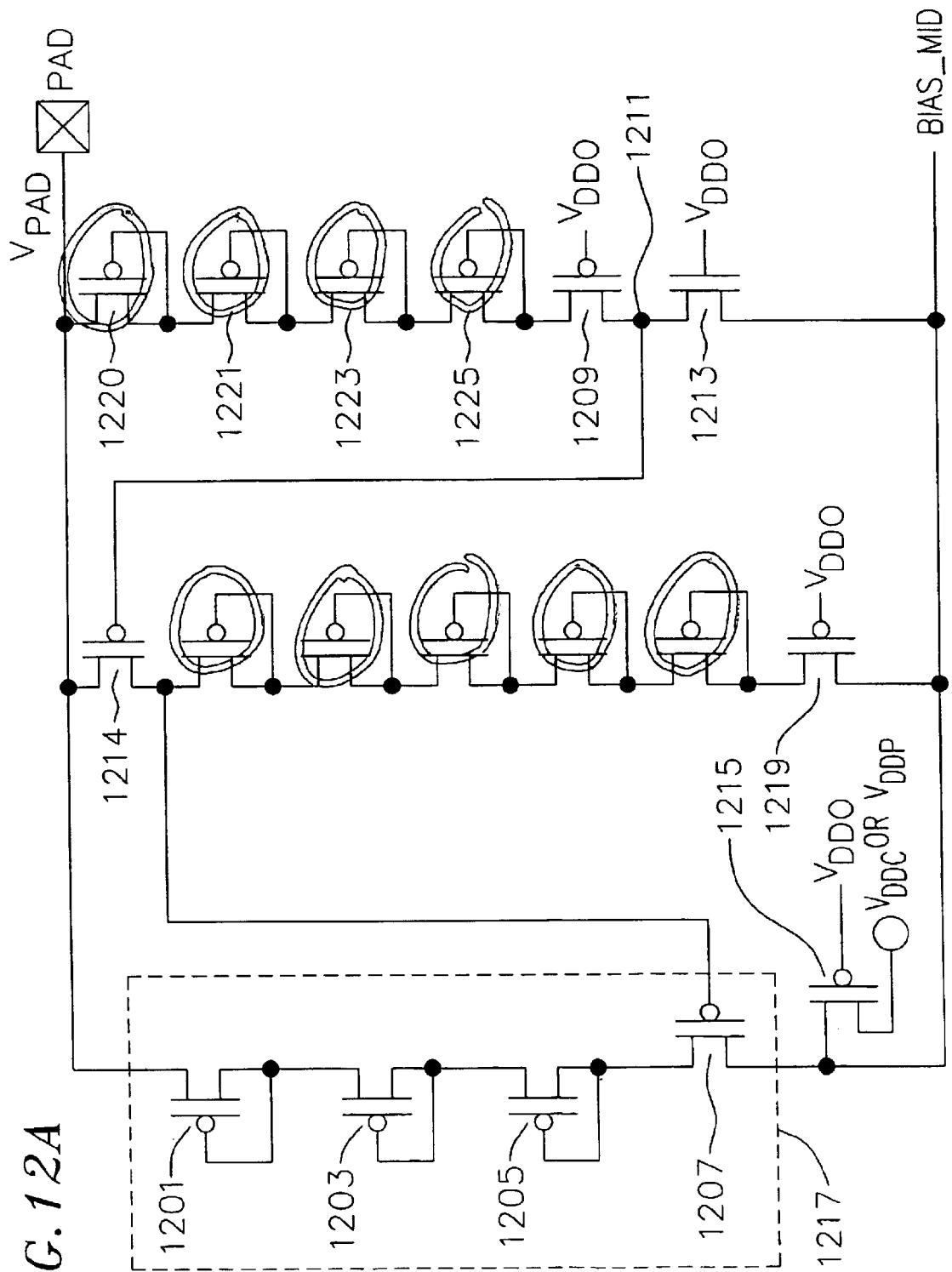
FIG. 12A is a schematic diagram of a circuit that may be used to prevent power on stress of devices, according to an embodiment of the invention.

FIG. 12A is a schematic diagram of a circuit that may be used to prevent power on stress of devices, according to an embodiment of the invention. The circuit illustrated in FIG. 12A may be used to generate the Bias__Mid voltage when $V_{DDO}$ is not up to its nominal value. If Bias__Mid is present then devices 305 and 307, shown in FIG. 8, will be protected from junction overvoltage problems even though the voltages, which ordinarily would be used to generate Bias__Mid as explained in FIG. 9A, are not present.

In FIG. 12A devices 1201, 1203, and 1205 are arranged as a series of diode connected transistors such that a threshold voltage $V_{TP}$ (in the present example equal to approximately 0.5 volts) is dropped across each device when it is conducting. When device 1207 is conducting, the pad voltage, minus the threshold voltage of devices 1201, 1203, 1205 and 1207, is connected to Bias__Mid. Device 1207, in essence, acts as a switch.

As an example, assume that $V_{DDO}$ is initially zero volts. Zero volts at the gate of device 1209 turns it on. In such case point 1211 charges to a potential close to the pad voltage, since device 1213 is off. Point 1211 is connected to the gate of device 1214 thereby turning device 1214 off. Since $V_{DDO}$ is zero volts, PMOS device 1219 turns on, which causes the gate of device 1207 to be coupled to Bias__Mid. When the gate of device 1207 is coupled to Bias__Mid, device 1207 turns on. Device 1207 turning on couples $V_{PAD}$ minus the threshold voltage of devices 1201, 1203, 1205 and 1207 to Bias__Mid. When $V_{DDO}$ is low, device 1215 provides coupling path for Bias__Mid to $V_{DDC}$ or $V_{DDP}$. When $V_{DDO}$ is low, the string of devices 1217 turns on and the pad voltage is coupled to Bias__Mid. Devices 1220, 1221, 1223 and 1225 act as protection for device 1209 in the instance where the $V_{PAD}$ is high and $V_{DDO}$ is low.

When $V_{DDO}$ is high, point 1211 is tied to Bias__Mid because device 1213 turns on. When $V_{DDO}$ is high, device 1219 is turned off and device 1213 is turned on, thus raising the potential at the base of device 1207 to $V_{PAD}$, thereby turning device 1207 off. Also device 1215 turns off when $V_{DDO}$ is high.

Figure 12B:
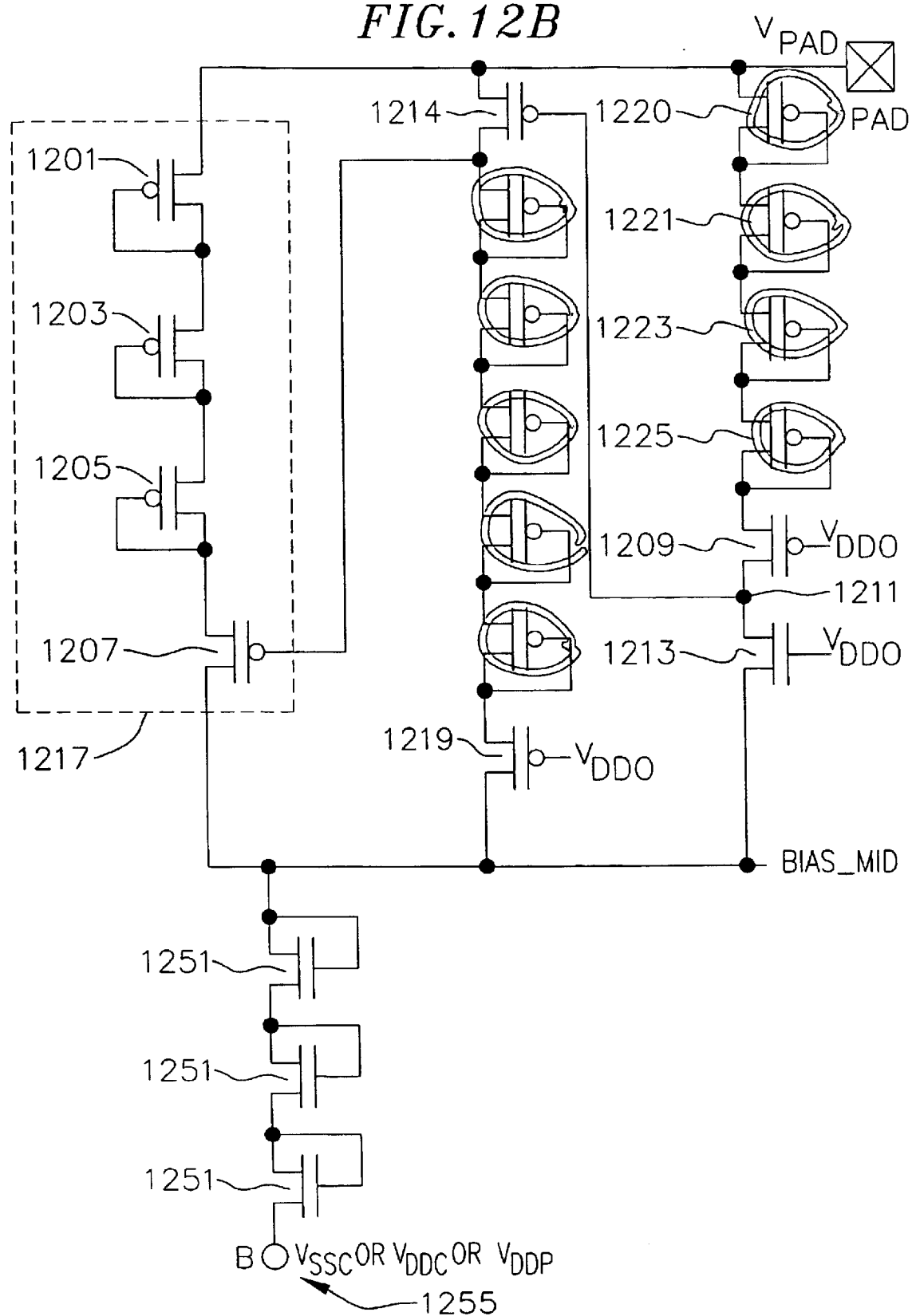
FIG. 12B is a schematic diagram of a circuit that may be used to prevent power on stress of devices, according to another embodiment of the invention.

FIG. 12B is a modification of the circuitry illustrated in FIG. 12A. The circuitry of FIG. 12B may also be used to prevent power on stress of devices. In FIG. 12B NMOS (N-channel Semiconductor) transistors 1251, 1252, and 1253 are added between Bias__Mid and node B, 1255.

Transistors 1251, 1252, and 1253 limit the maximum value of Bias__Mid to approximately $V_B + 3V_{Tn}$ where $V_B$ is the voltage of node B and $V_{Tn}$ is the threshold voltage of transistors 1251, 1252, and 1253. In general if there are n NMOS transistors similarly connected in series, the maximum value of Bias__Mid is approximately $V_B + 3V_{Tn}$. Node B alternatively could b coupled to a power supply voltage such as $V_{DDP}$, $V_{DDC}$ or $V_{SSC}$. The minimum value of Bias__Mid is approximately $V_{pad} - 4V_{Tp}$, where $V_{Tp}$ is the threshold voltage of transistors 1201, 1203, 1205, 1207.

Figure 13:
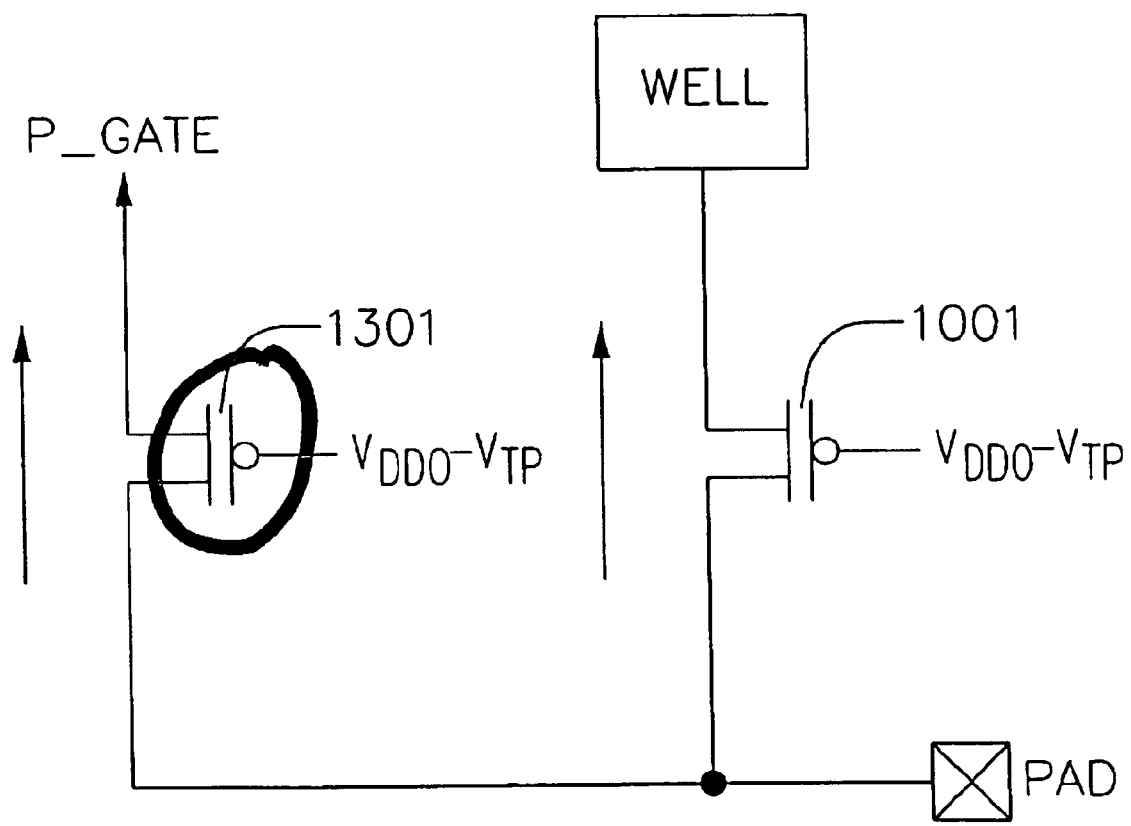
FIG. 13 is a circuit and block diagram of a portion of an overvoltage protection circuit.

FIG. 13 is a circuit and block diagram of a portion of an over voltage protection circuit. Device 1001 provides a protection mechanism for the well bias. If $V_{DDO}$ is lower than the pad voltage by $V_{TP}$ or more then device 1001 will turn on. If device 1001 turns on then the well is coupled, via device 1001, to the pad, and hence the well will be biased to $V_{PAD}$.

Similarly device 1301 is coupled between the pad and P__Gate, the gate of PMOS device 303 shown in FIG. 6. The gate of device 1301 is biased so that when $V_{DDO}$ is lower than the pad voltage by $V_{Tp}$ or more, then device 1301 will turn on and couple P__Gate to the pad voltage, therefore if $V_{DDO}$ is low then P__Gate will not depend on $V_{DDO}$ for it's voltage level and instead will take the voltage level from the voltage on the pad.

Figure 14:
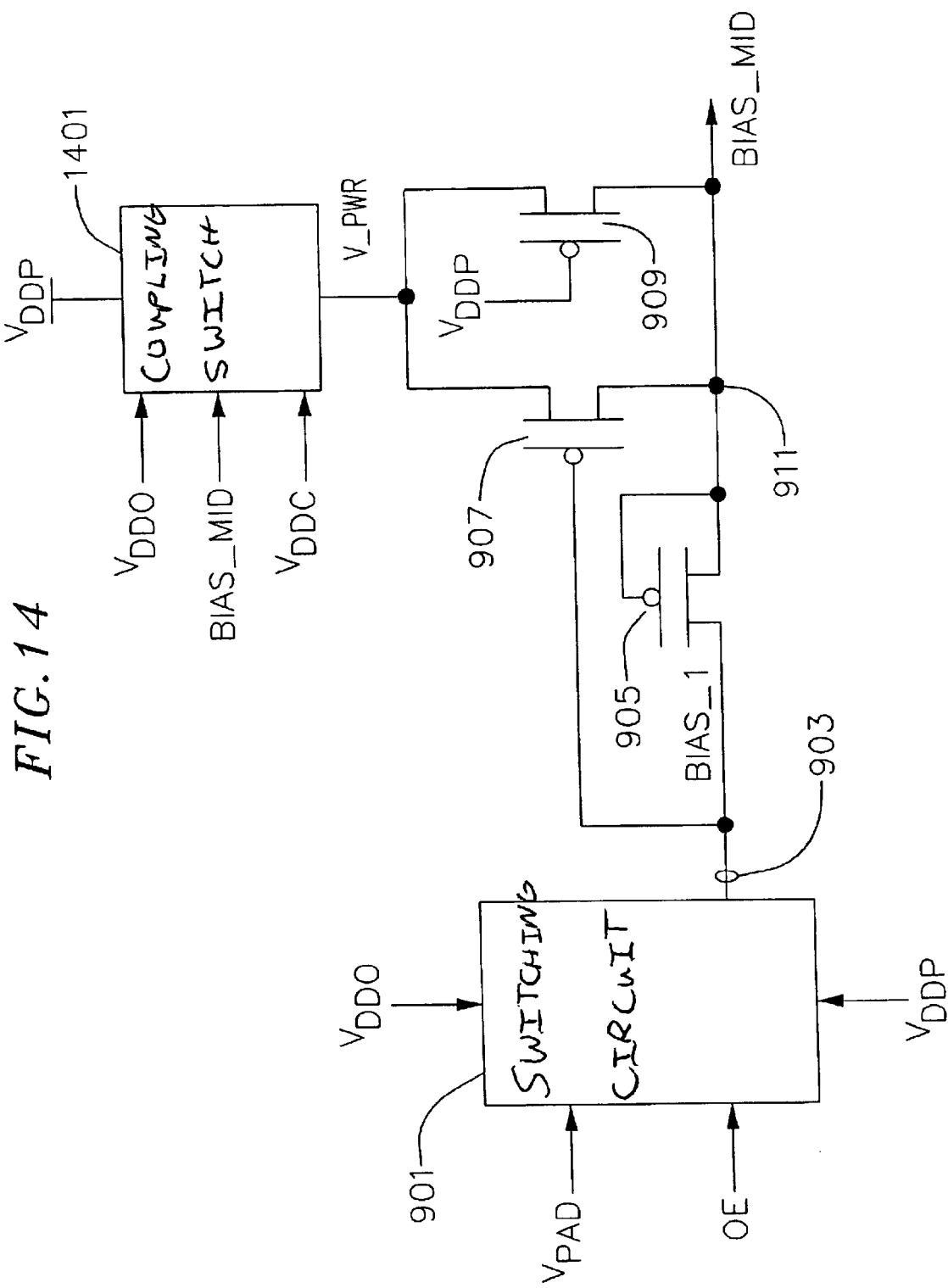
FIG. 14 is a schematic diagram illustrating a modification of FIG. 9A.

FIG. 14 is a schematic diagram illustrating a modification of FIG. 9A. In FIG. 14 block 901 is decoupled from the Bias__Mid signal when $V_{DDO}$ is lower than its nominal value. The decoupling is done using block 1401. When $V_{DDO}$ is not up to its nominal value, the node V__pwr is decoupled from $V_{DDP}$ by using block 1401 as a switch. When $V_{DDO}$ is up to its nominal value, the node V__pwr is coupled to $V_{DDP}$ by using block 1401.

Figure 15:
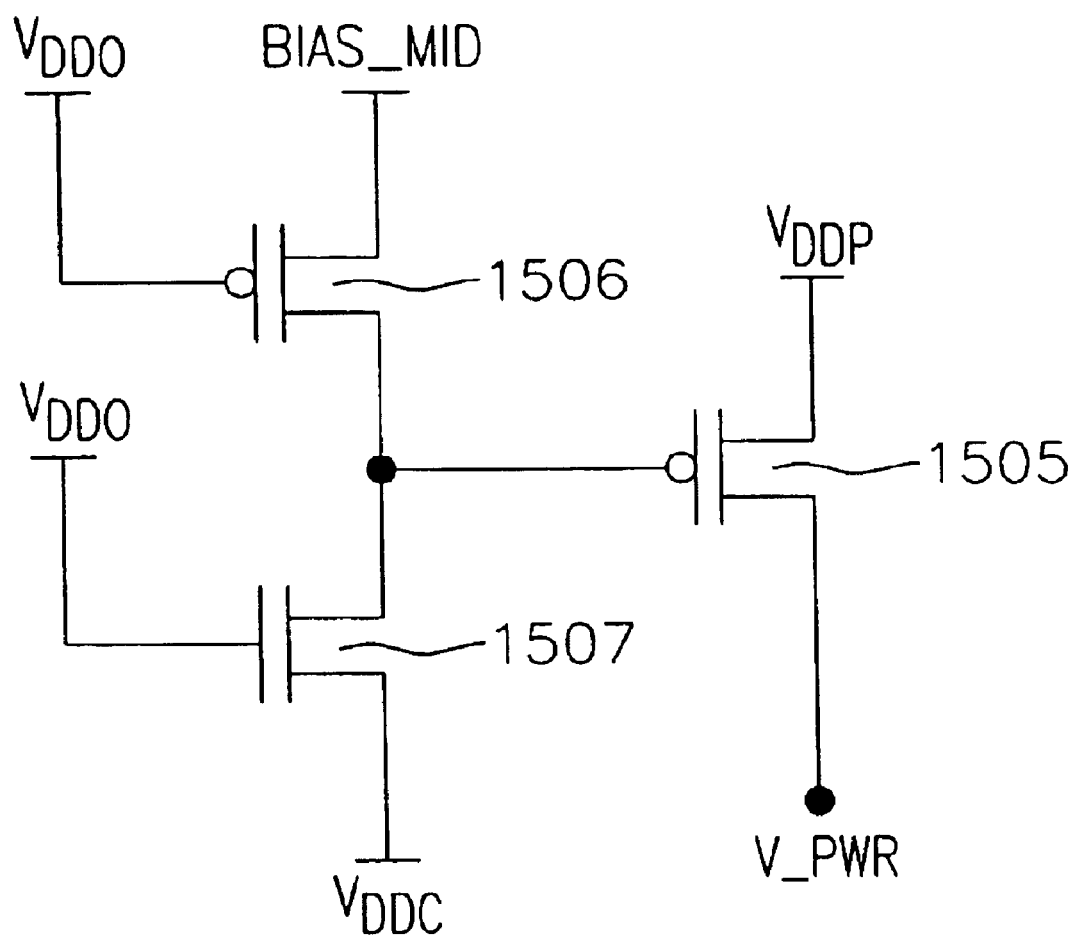
FIG. 15 is a schematic diagram illustrating a transistor implementation of block 1401.

FIG. 15 is a schematic diagram illustrating a transistor implementation of block 1401. When $V_{DDO}$ is greater than a certain value, NMOS 1507 is turned on thereby connecting the gate of PMOS 1505 to $V_{DDC}$. Connecting the gate of PMOS 1505 to $V_{DDC}$ turns on 1505 thereby connecting V__pwr to $V_{DDP}$. When $V_{DDO}$ is less than a certain value, NMOS 1507 is turned off and PMOS 1506 is turned on thereby connecting the gate of PMOS 1505 to Bias__Mid, thereby turning off PMOS 1505 and disconnecting V__pwr from $V_{DDP}$.

Figure 16:
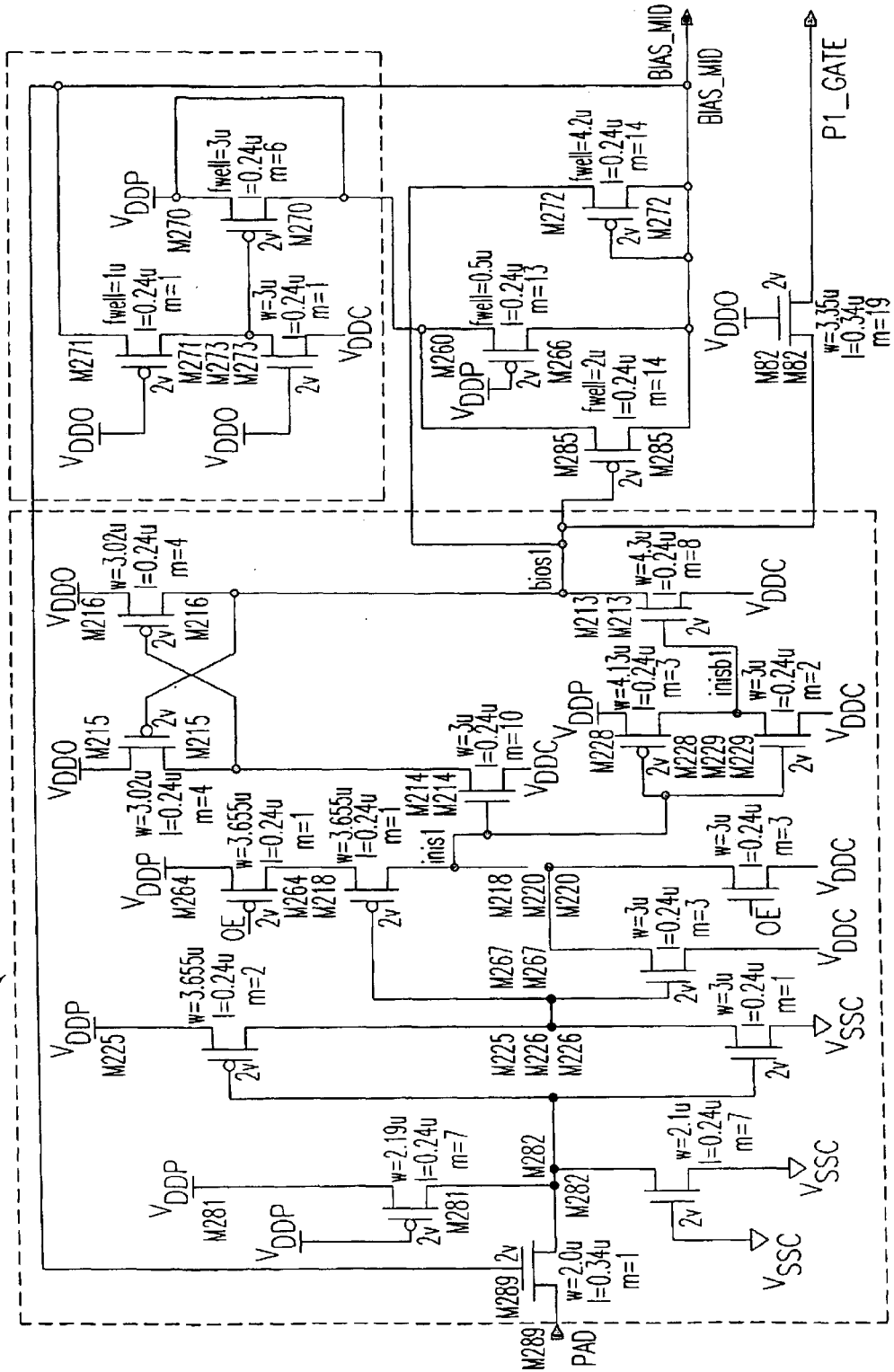
FIG. 16 is a schematic diagram illustrating a transistor implementation of FIG. 14.

FIG. 16 is a schematic diagram illustrating a transistor implementation of FIG. 14.

Figure 17:
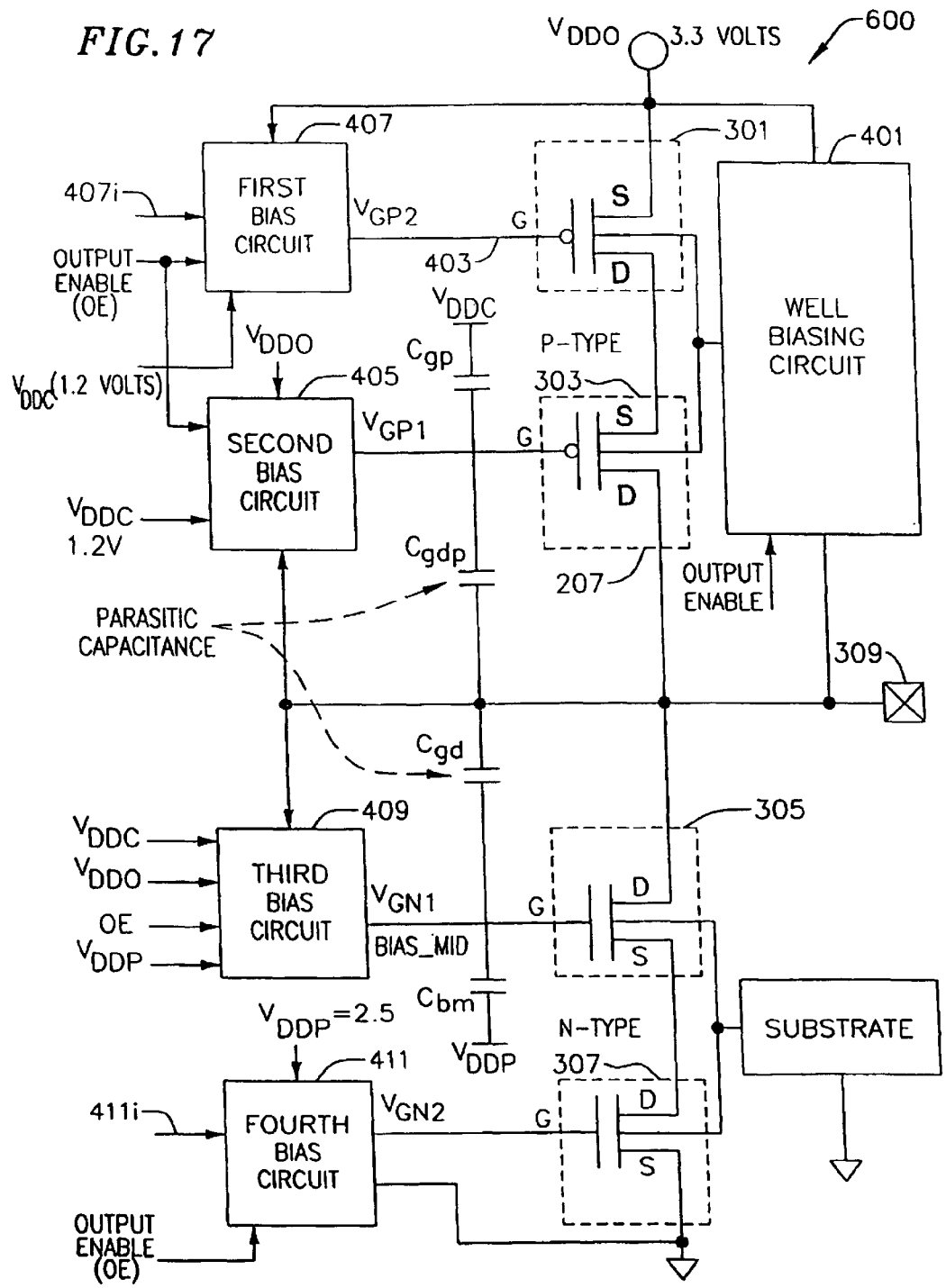
FIG. 17 is a schematic diagram of a circuit that may be used to prevent stress on devices when voltage spikes appear at an I/O pad.

FIG. 17 is a schematic diagram of a circuit that may be used to prevent stress on devices when voltage spikes appear at the pad. When transient voltages appear, the Bias__Mid voltage changes momentarily due to the gate to drain overlap capacitance (Cgd) of the driver NMOS. A capacitance (Cbm) is placed at the bias__mid node such that the transient voltage at the pad (V__pad, transient) gets divided between Cgd and Cbm depending on the ratio of the capacitances which gives the additional transient voltage on bias__mid (V__bm, transient): $\Delta V$__bm, transient=(Cgd/(Cgd+Cbm))*$\Delta V$__pad, transient Also, when transient voltages appear, the voltage $V_{GP1}$ on PMOS 207 gate changes momentarily due to the gate to drain overlap capacitance (Cgdp) of the driver PMOS. A capacitance (Cgp) is placed at the PMOS 207 gate node such that the transient voltage at the pad (V__pad, transient) gets divided between Cgdp and Cgp depending on the ratio of the capacitances which gives the additional transient voltage on PMOS 207 gate ($V_{GP1+}$Transient): $V_{GP1+}$Transient=(Cgdp/(Cgdp+Cgp))*$\Delta V$__pad, transient.

Figure 18:
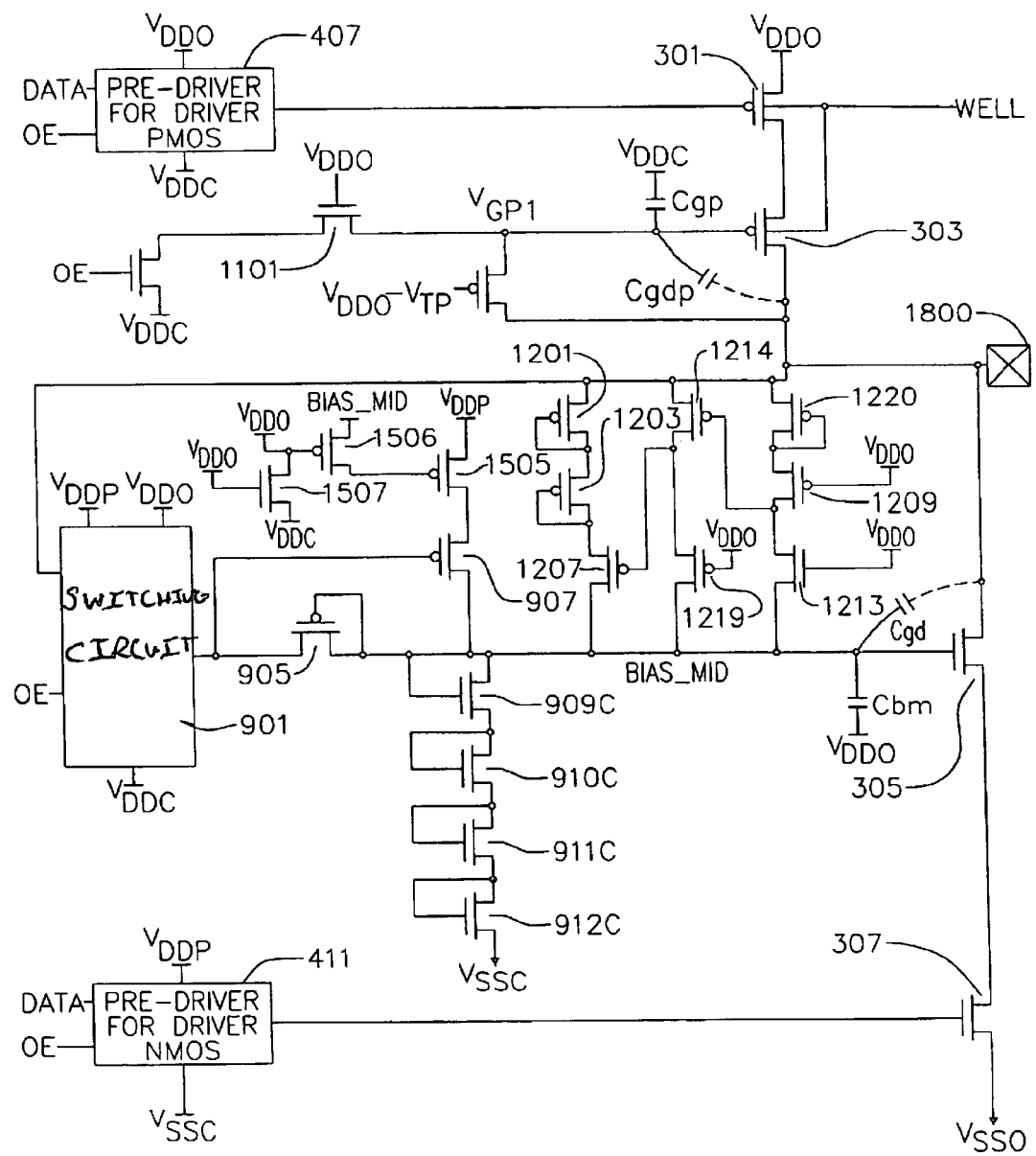
FIG. 18 is an embodiment of a circuit including multiple cooperating embodiments, such as those illustrated above.
Figure 4:
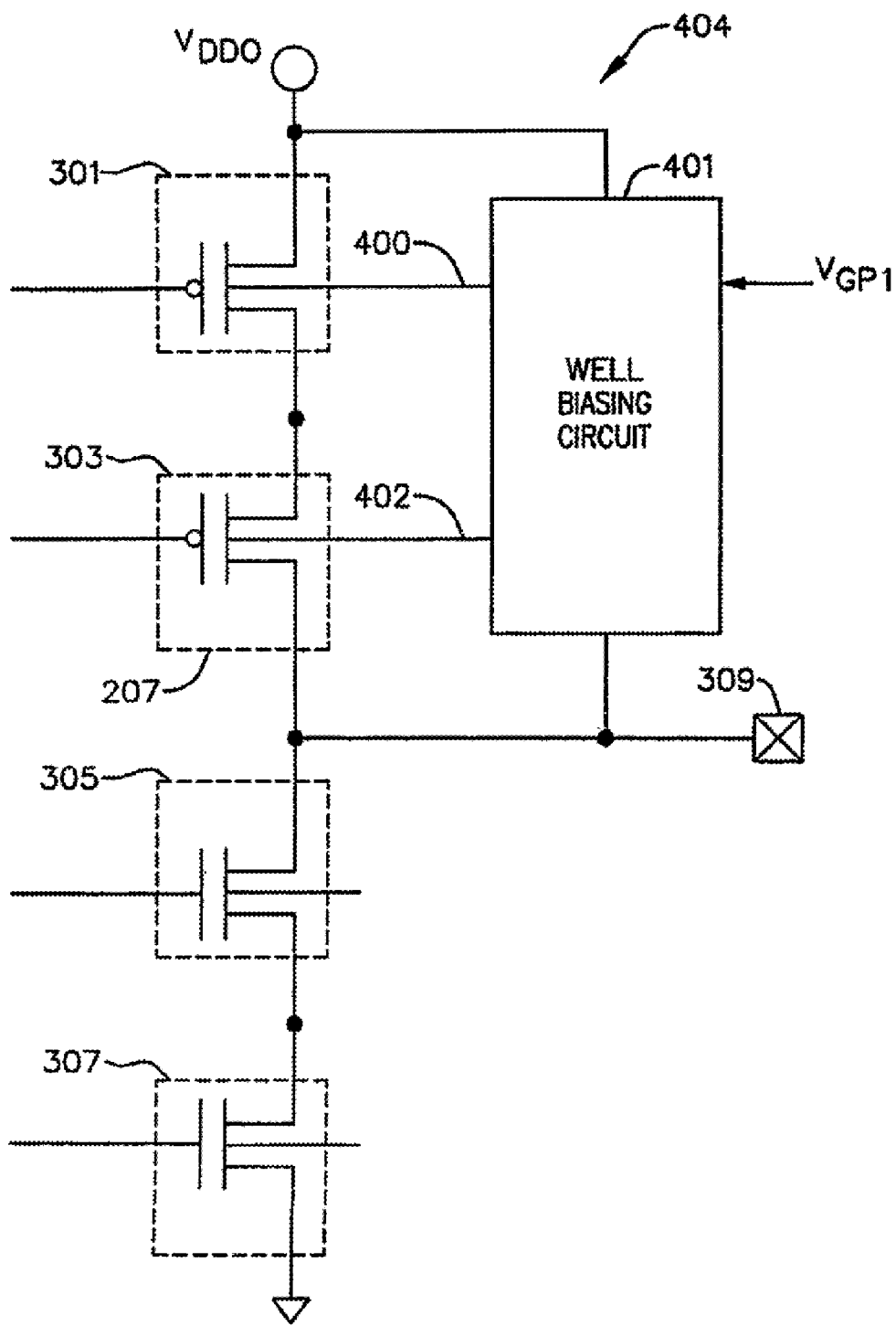
Figure 6:
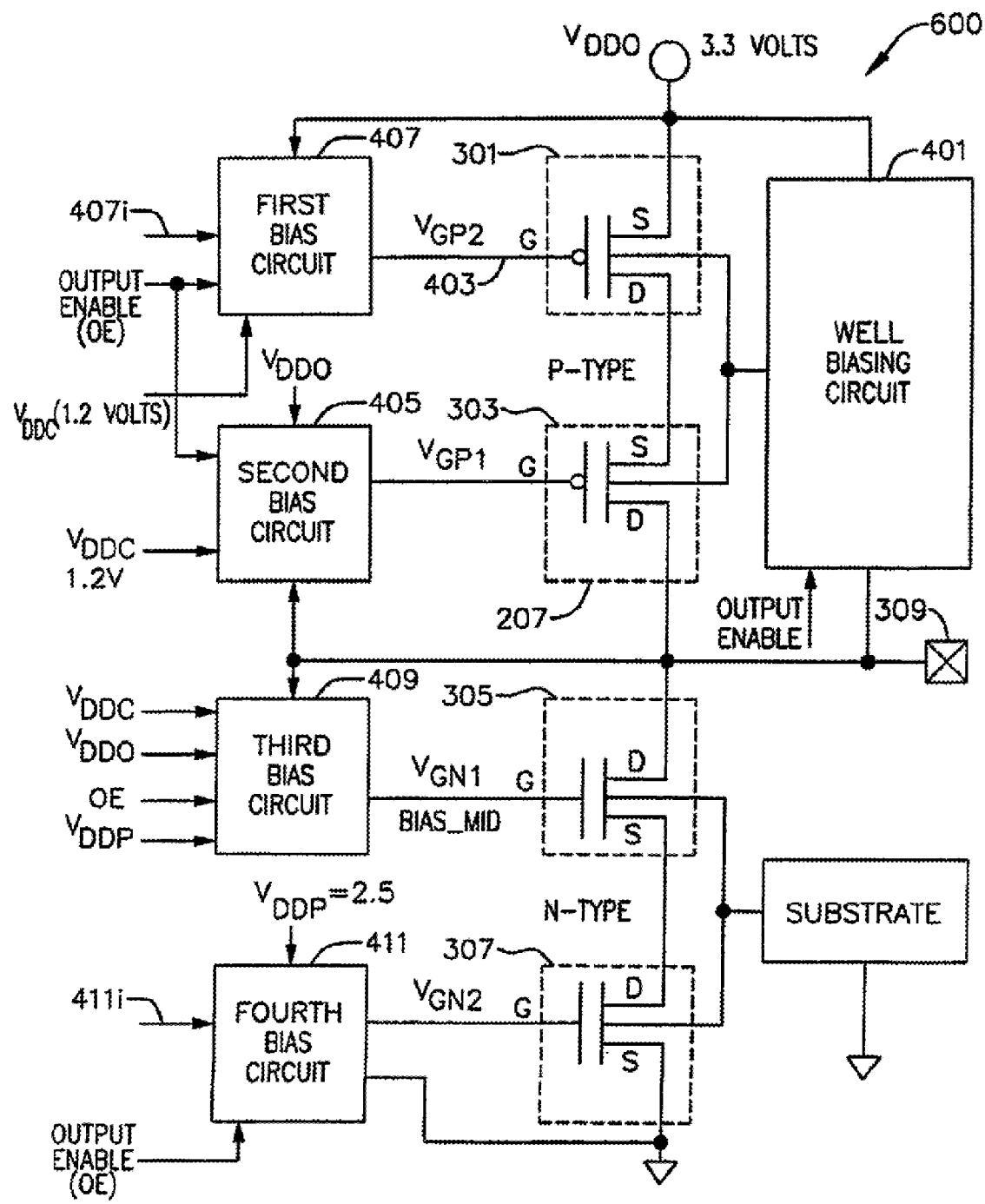
Figure 9A:
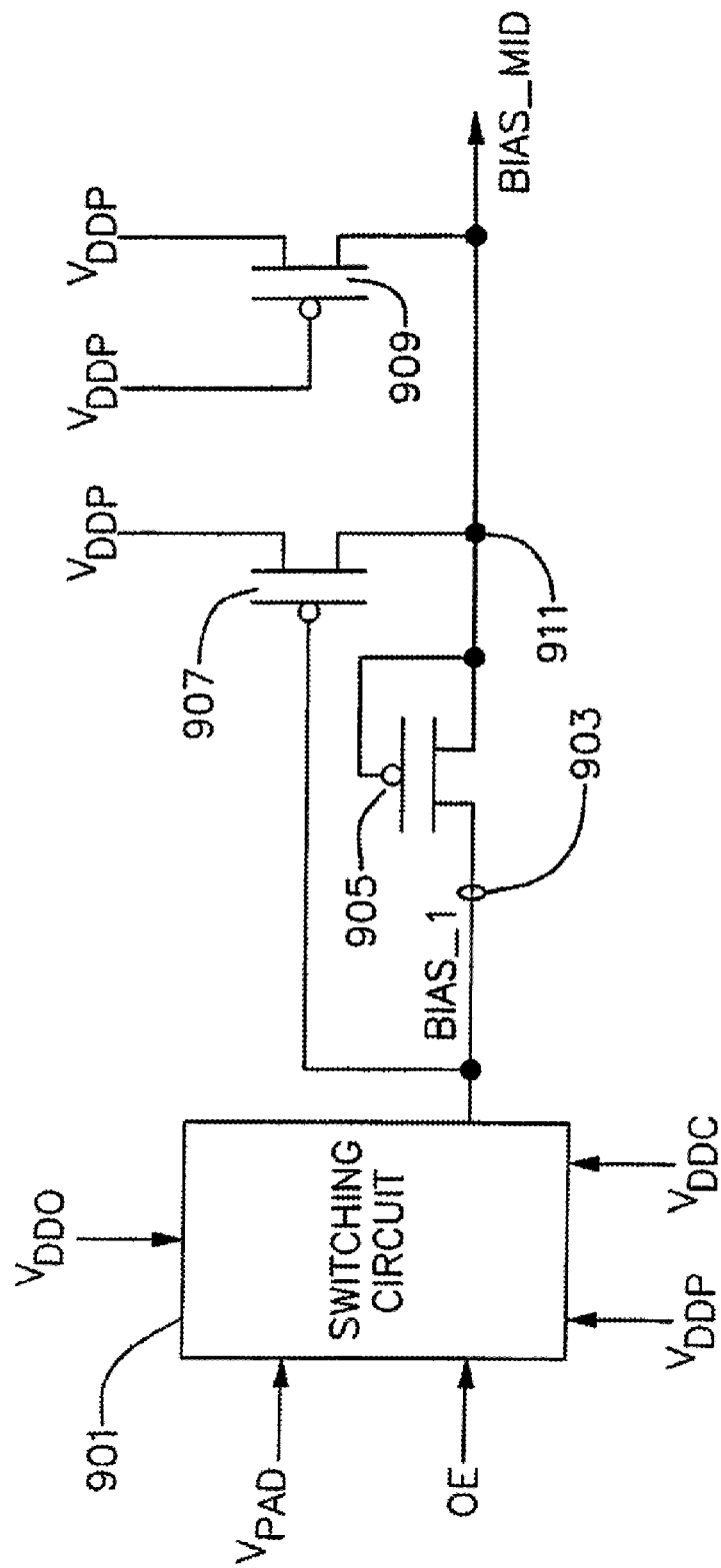
Figure 10:
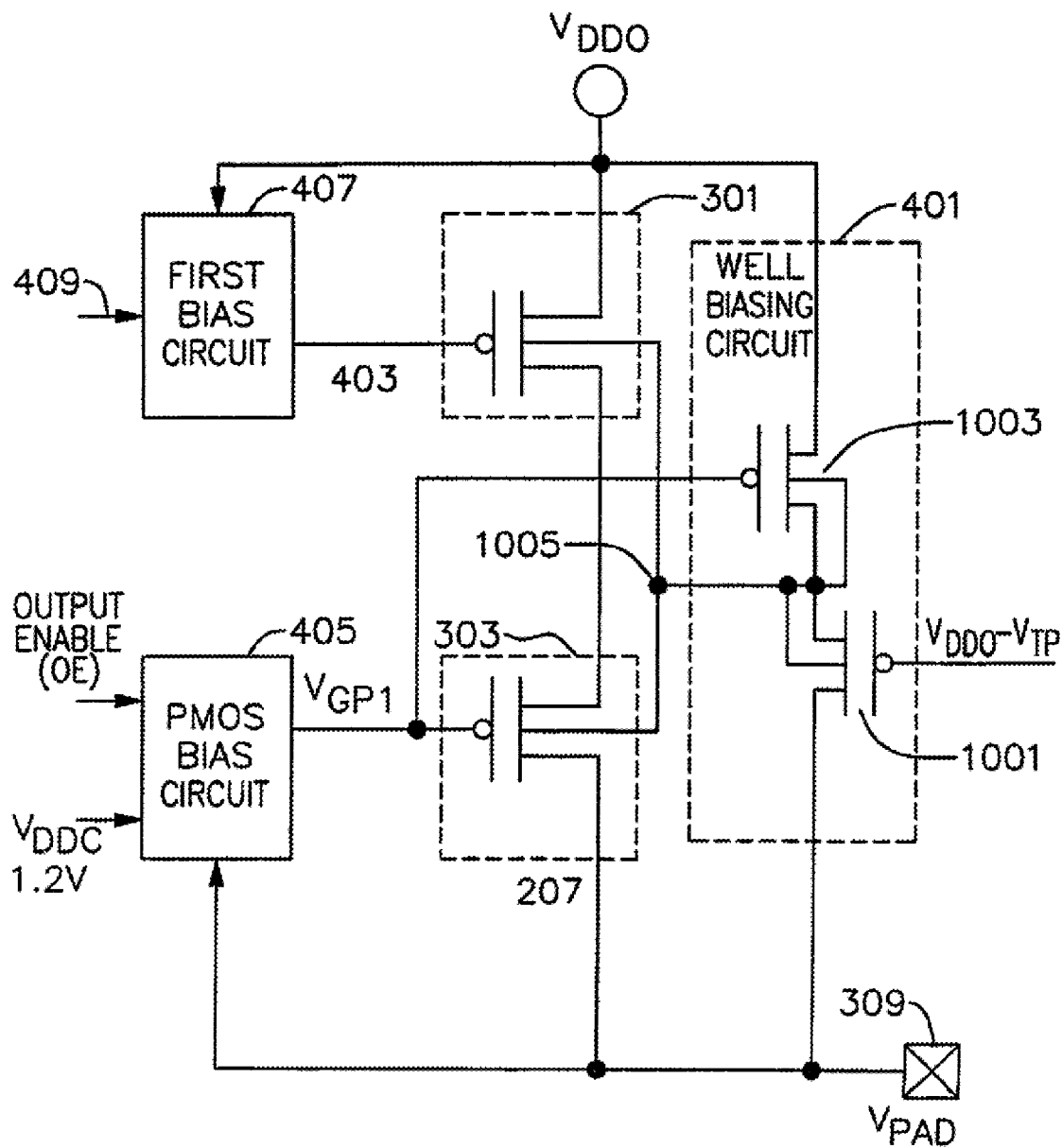
Figure 11A:
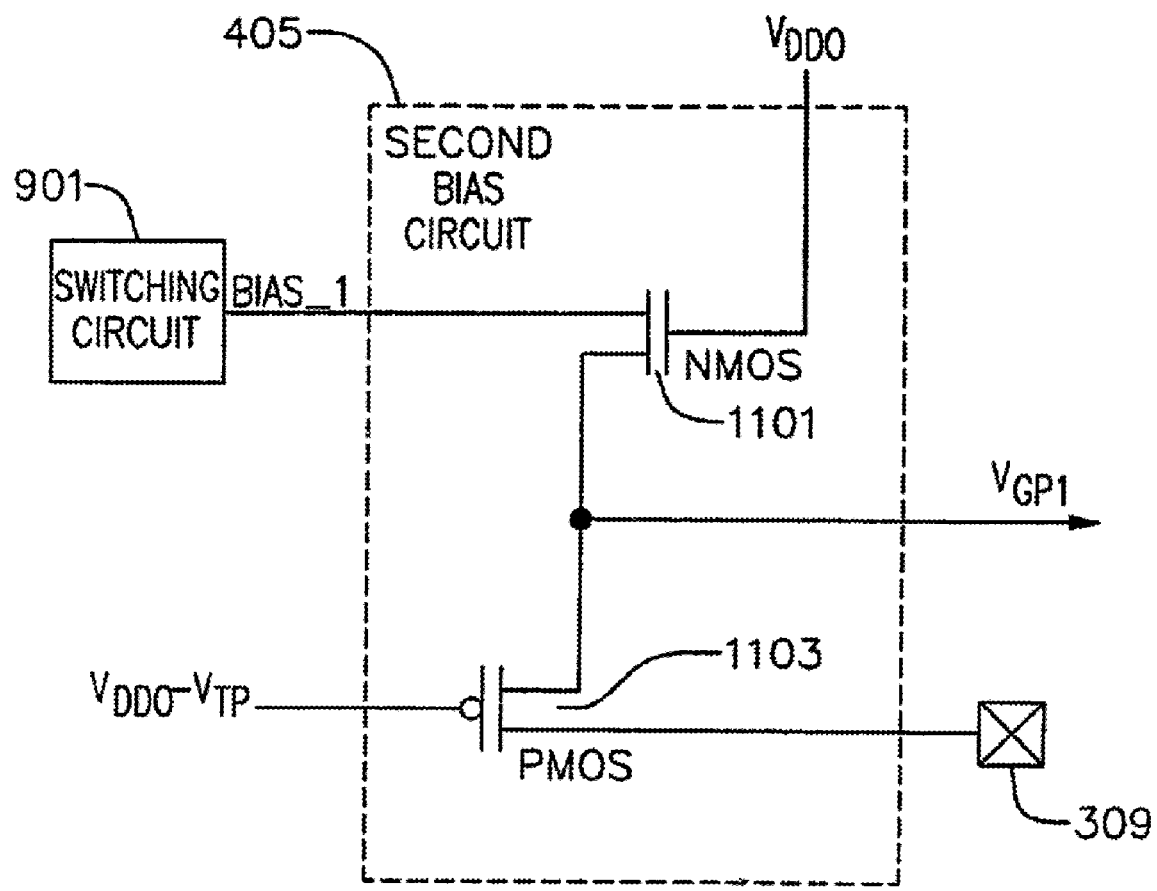
Figure 12A:
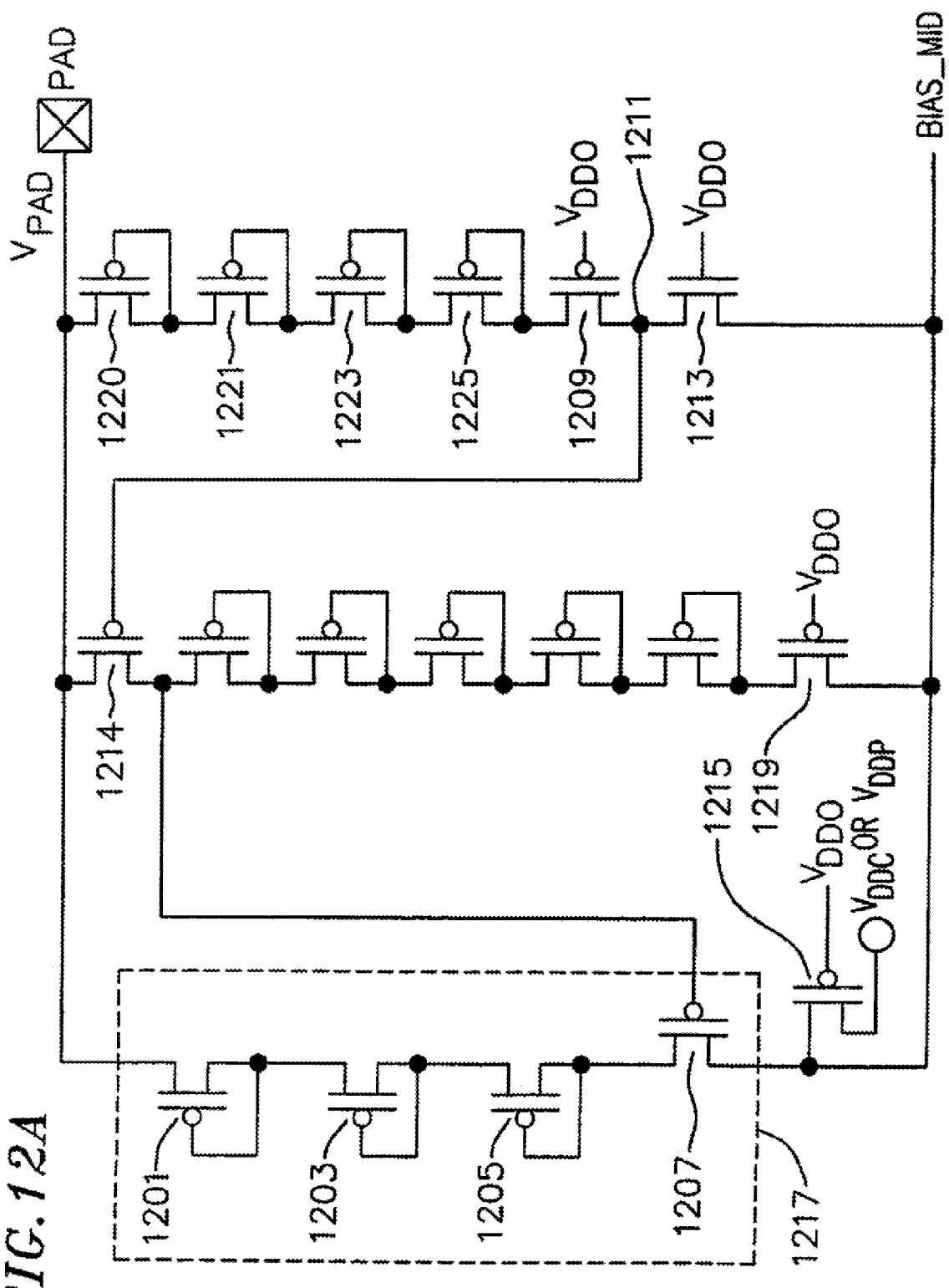
Figure 12B:
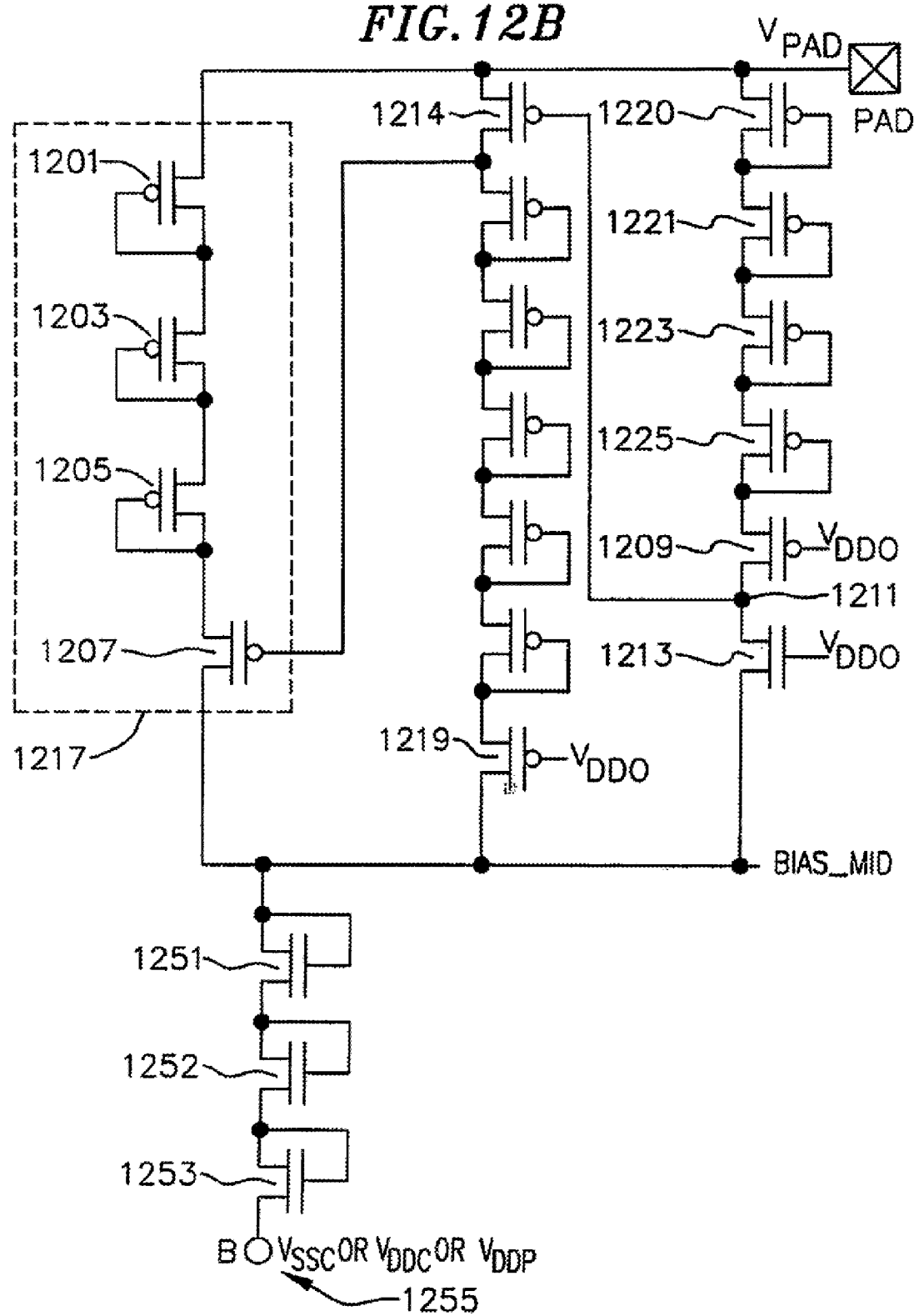
Figure 13:
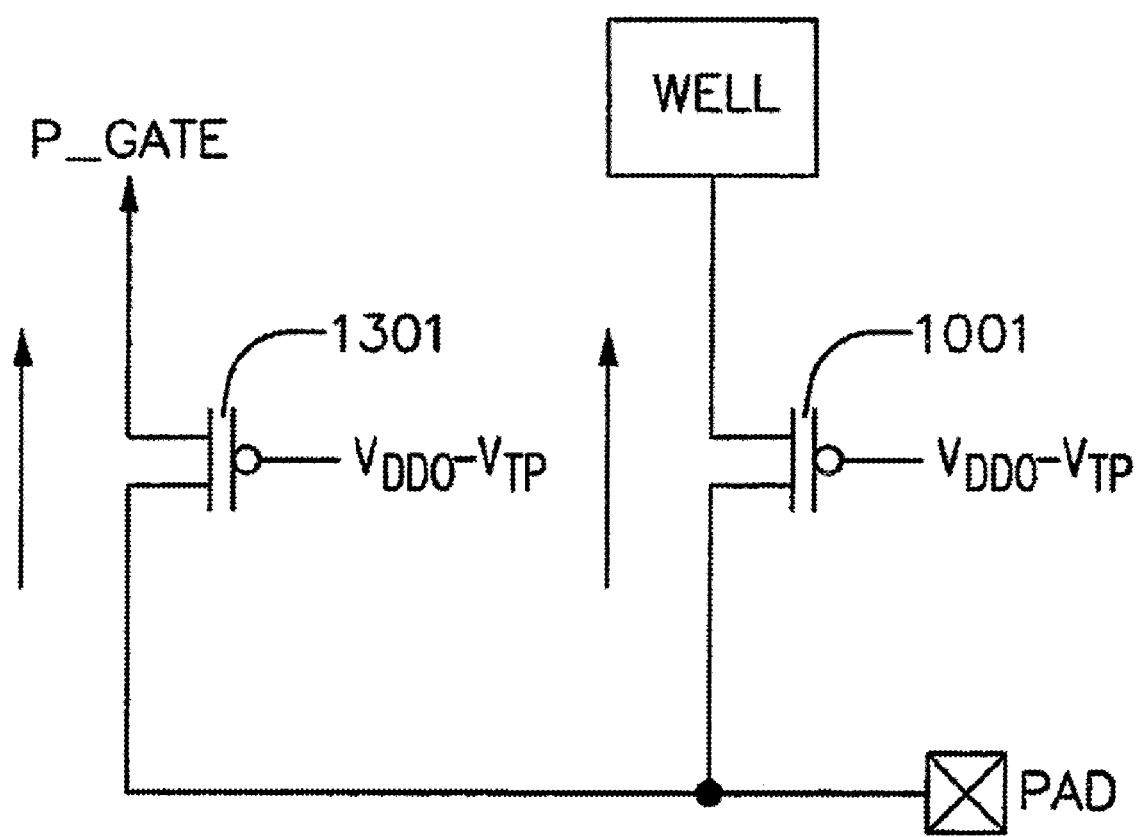
Figure 14:
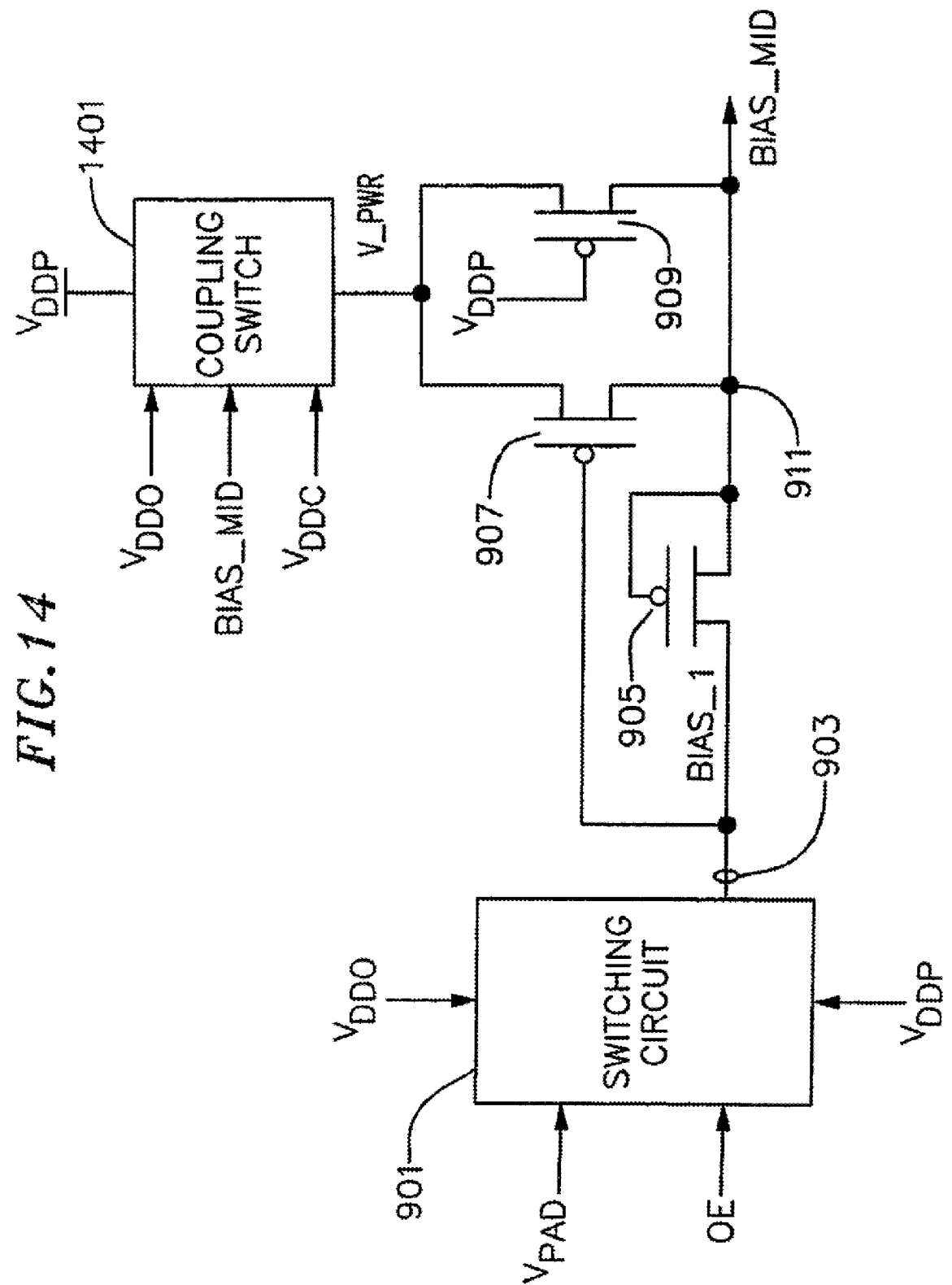
Figure 18:
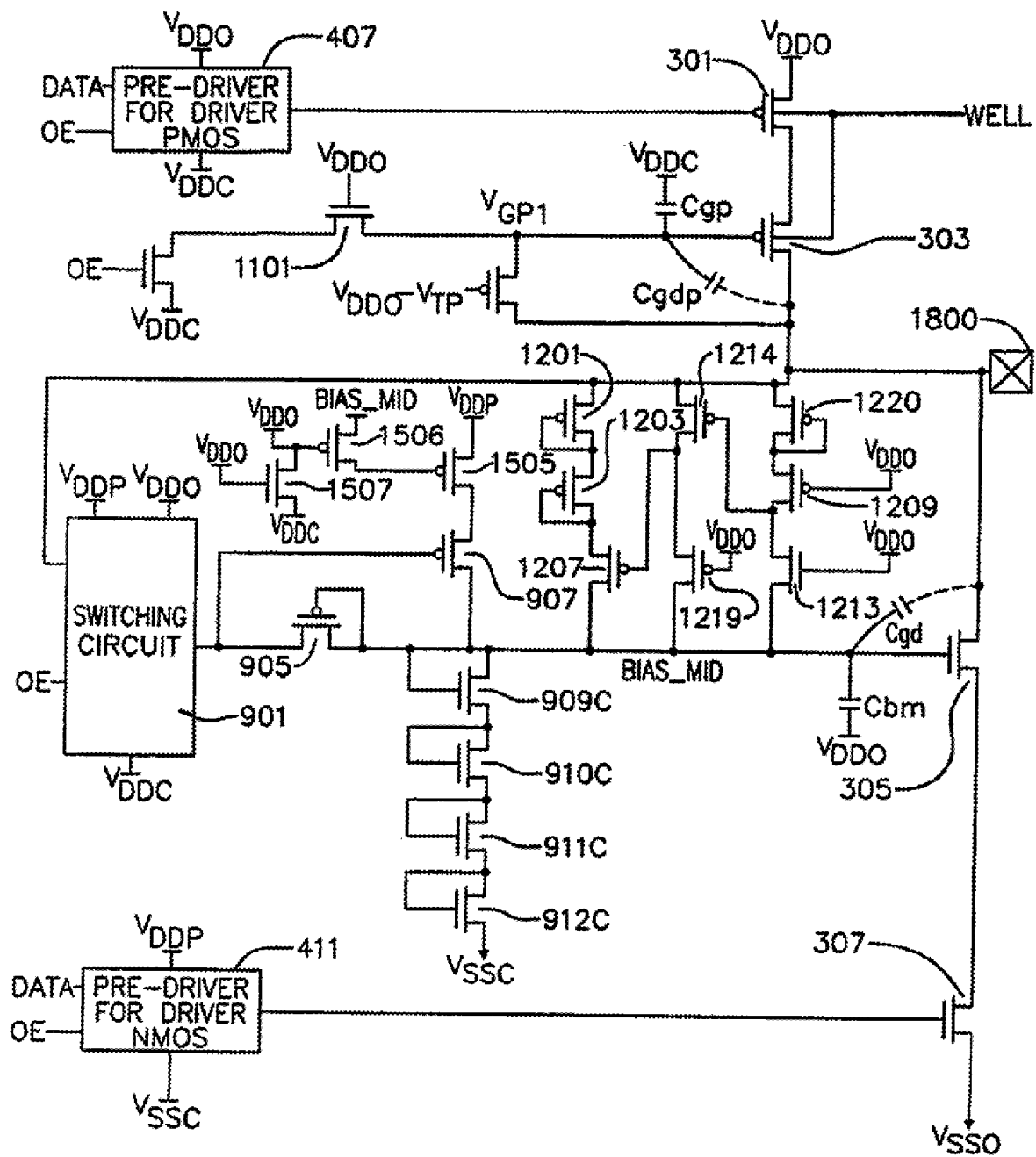

FIG. 18 is an embodiment of a circuit including multiple cooperating embodiments, such as those illustrated previously. The I/O circuit of FIG. 18 employs 2.5 volt transistors, with an output voltage of 3.3 volts and a maximum input voltage of 5.5 Volts. The power supply voltages illustrated are $V_{DDO}$=3.3 volts, $V_{DDP}$=2.5 volts, $V_{DDC}$=1.2 volts, $V_{SSO}$ is 0 volts and $V_{SSC}$ is 0 volts. The functioning of the circuit is described below.

When $V_{DDO}$ is above a predetermined value, for example 2.5 volts, and the I/O pad 1800 is enabled in an output mode (for example output enable signal OE is high). Under these conditions the maximum pad voltage is $V_{DDO}$. $V_{GP1}$ (the gate of PMOS device 303) is coupled to $V_{DDC}$ through NMOS transistors 1101 and 1801, and accordingly PMOS 303 and PMOS 1505 are turned on. Block 901 generates an output Bias_1 voltage of $V_{DDC}$. PMOS 907 is turned-on in this condition, Bias_Mid has a steady state value of $V_{DDP}$ and PMOS 905 is turned off.

When $V_{DDO}$ is below a predetermined value (in the present example 2.5 volts) and I/O pad 1800 is output enabled (i.e. OE is high) then $V_{GP1}$, the gate of PMOS device 303, is floating. Additionally PMOS device 1505 is turned-off and hence Bias_Mid is decoupled from $V_{DDP}$. PMOS devices 1201, 1203 and 1207 are turned on. Therefore the Bias_Mid steady-state voltage is between $V_{PAD}-kV_{Tp}$ and $V_{SSC}+nV_t$ where $kV_{Tp}$ and $nV_t$ are offset voltages due to the threshold voltages of PMOS semiconductor devices 1201, 1203, 1207 and NMOS semiconductor devices 909c, 910c, 911c and 912c respectively. Where k and n are integers reflecting a number of devices.

When $V_{DDO}$ is above a pre-determined value, for example 2.5 volts, and when the I/O pad is in an output disabled condition (i.e. OE is low) and the pad voltage is below the predetermined voltage, for example 2.5 volts, then the following circuit conditions are present. PMOS device 1505 is turned on. Block 901 generates an output, Bias_1, voltage of $V_{DDC}$, accordingly PMOS device 907 is turned-on and the steady state voltage of Bias_Mid is $V_{DDP}$. PMOS 905 is turned off under these conditions. $V_{GP1}$ (at the gate of PMOS device 303) is connected to the pad voltage, if $V_{PAD}$ is greater than $V_{DDO}$ otherwise $V_{GP1}$ is floating.

When $V_{DDO}$ is above a pre-determined value, for example 2.5 volts, and when the I/O pad is in an output disabled condition (i.e. OE is low) and the pad voltage is above the predetermined voltage, for example 2.5 volts, then the following circuit conditions are present. Block 901 generates an output Bias_1 voltage of $V_{DDO}$. Accordingly PMOS device 907 is turned off, PMOS device 905 is turned on and the steady state Bias_Mid voltage is between $V_{DDO}-V_{DDP}$, as a minimum value, and $V_{SSC}+nV_T$, as a maximum value. The value $nV_T$ is an offset voltage due to the threshold values of NMOS devices 909c, 910c, 911c and 912c. $V_{GP1}$ the gate of PMOS 303, is coupled to the pad voltage, $V_{PAD}$, if $V_{PAD}$ is greater than $V_{DDO}$.

When $V_{DDO}$ is below a pre-determined value, for example 2.5 volts, and when the I/O pad is in an output disabled condition (i.e. OE is low), then the following circuit conditions are present. PMOS device 1505 is turned-off and hence Bias_Mid is disconnected from $V_{DDP}$. PMOS devices 1201, 1203, and 1207 are turned on. The steady state value of the Bias_Mid voltage is between $V_{PAD}-kV_{Tp}$ and $V_{SSC}+nV_t$, where $kV_{Tp}$ and $nV_t$ are offset voltages due to the threshold voltages of PMOS devices 1201, 1203, 1207 and NMOS devices 909c, 910c, 911c, and 912c. $V_{GP1}$, at the gate of PMOS device 303 is coupled to the pad voltage ($V_{PAD}$) if $V_{PAD}$ is greater than $V_{DDO}$. Under these conditions PMOS device 303 is turned off.

Capacitors $C_{bm}$ and $C_{gp}$ in FIG. 18 are used to insure that Bias_Mid voltage and $V_{GP1}$ voltage, respectively, are kept at desirable levels when transient voltages appear at the pad as described with respect to FIG. 17.

What is claimed is:

1. A method of protecting an integrated circuit from over voltage, the method comprising:
   accepting a voltage from a power supply input to the integrated circuit;
   accepting a pad voltage from an external voltage source;
   comparing the power supply voltage to a predetermined value;
   coupling a bias voltage for the integrated circuit to a gate of a PMOS (P-channel Metal Oxide Semiconductor) device when the power supply is below the predetermined value; and
   coupling the pad voltage to a bias_mid node through the PMOS device to provide the bias voltage for the integrated circuit when the power supply is below the predetermined value,
   wherein coupling the bias voltage for the integrated circuit to the gate of the PMOS (P-channel Metal Oxide Semiconductor) device when the power supply is below the predetermined value comprises coupling the bias voltage to the gate of the PMOS (P-channel Metal Oxide Semiconductor) device through a first plurality of diode connected MOS devices when the power supply is below the predetermined value.

2. A method of protecting an integrated circuit from over voltage, the method comprising:
   accepting a voltage from a power supply input to the integrated circuit;
   accepting a pad voltage from an external voltage source;
   comparing the power supply voltage to a predetermined value;
   coupling a bias voltage for the integrated circuit to a gate of a PMOS (P-channel Metal Oxide Semiconductor) device when the power supply is below the predetermined value; and
   providing the pad voltage to an input of a plurality of diode connected MOS devices; and
   coupling an output of the plurality of diode connected MOS devices to the drain of the PMOS device to couple the pad voltage to a bias_mid node to provide the bias voltage for the integrated circuit when the power supply is below the predetermined value.

3. A method for generating a bias voltage (bias_mid) from a pad voltage (Vpad), when a power supply ($V_{DDO}$) is not present the method comprising:
   providing $V_{DDO}$ to a gate of a first semiconductor device;
   providing bias_mid to a source of the first semiconductor device such that the first semiconductor device will turn off when $V_{DDO}$–bias_mid is less than the threshold of the first semiconductor device; and
   providing bias_mid to a gate of a MOS device in response to the turn off of the first semiconductor device to turn on the MOS device to couple Vpad to bias_mid,
   wherein providing bias_mid to the gate of the MOS device in response to the turn off of the first semiconductor device to turn on the MOS device to couple Vpad to bias_mid comprises:
      turning on a second semiconductor device and turning off a third semiconductor device which is coupled to the second semiconductor device thereby providing bias_mid to the gate of the MOS device to turn on the MOS device; and using the turn on of the MOS device to couple Vpad to bias_mid, and wherein using the turn on of the MOS device to couple Vpad to bias_mid comprises:

providing the pad voltage to an input of a first plurality of diode connected MOS devices; and coupling an output of the first plurality of diode connected MOS devices to the drain of the MOS device.

4. A method for generating a bias voltage (bias_mid) from a pad voltage (Vpad), when a power supply ($V_{DDO}$) is not present the method comprising:

providing $V_{DDO}$ to a gate of a first semiconductor device;

providing bias_mid to a source of the first semiconductor device such that the first semiconductor device will turn off when $V_{DDO}$–bias_mid is less than the threshold of the first semiconductor device; and providing bias_mid to a gate of a MOS device in response to the turn off of the first semiconductor device to turn on the MOS device to couple Vpad to bias_mid, wherein providing bias_mid to the gate of the MOS device comprises providing bias_mid to the gate of the MOS device through a second plurality of diode connected MOS devices in response to the turn off of the first semiconductor device.

5. A method for generating a bias voltage (bias_mid) from a pad voltage (Vpad), when a power supply ($V_{DDO}$) is not present the method comprising:

providing $V_{DDO}$ to a gate of a first semiconductor device;

providing bias_mid to a source of the first semiconductor device such that the first semiconductor device will turn off when $V_{DDO}$–bias_mid is less than the threshold of the first semiconductor device; and providing bias_mid to a gate of a MOS device in response to the turn off of the first semiconductor device to turn on the MOS device to couple Vpad to bias_mid, wherein providing bias_mid to the gate of the MOS device in response to the turn off of the first semiconductor device to turn on the MOS device to couple Vpad to bias_mid comprises:

turning on a second semiconductor device and turning off a third semiconductor device which is coupled to the second semiconductor device thereby providing bias_mid to the gate of the MOS device to turn on the MOS device; and using the turn on of the MOS device to couple Vpad to bias_mid, and wherein turning on a second semiconductor device and turning off a third semiconductor device comprises turning on a second semiconductor device, coupling Vpad to a gate of the third semiconductor device through a third plurality of diode connected MOS devices and the second semiconductor device to turn off the third semiconductor device.

6. The method of claim 2 further comprising:

providing $V_{DDO}$ to a gate of a first semiconductor device providing the bias voltage for the integrated circuit to a source of the first semiconductor device such that the first semiconductor device will turn off when $V_{DDO}$ minus the bias voltage for the integrated circuit is less than the threshold of the first semiconductor device; and providing the bias voltage for the integrated circuit to the PMOS (P-channel Metal Oxide Semiconductor) device in response to the turn off of the first semiconductor device to couple the pad voltage to a bias_mid node to provide the bias voltage for the integrated circuit when the power supply is below the predetermined value.

7. The method of claim 2 wherein providing the bias voltage for the integrated circuit to the gate of the PMOS (P-channel Metal Oxide Semiconductor) device in response to the turn off of the first semiconductor device to couple the pad voltage to a bias_mid node comprises:

turning on a second semiconductor device and turning off a third semiconductor device which is coupled to the second semiconductor device thereby providing the bias voltage for the integrated circuit to the gate of the PMOS (P-channel Metal Oxide Semiconductor) device to turn on the PMOS (P-channel Metal Oxide Semiconductor) device; and using the turn on of the PMOS (P-channel Metal Oxide Semiconductor) device to couple the pad voltage to a bias_mid node comprises.

8. The method of claim 7 wherein turning on a second semiconductor device and turning off a third semiconductor device comprises turning on a second semiconductor device, coupling the bias voltage for the integrated circuit to a gate of the third semiconductor device through a third plurality of diode connected MOS devices and the second semiconductor device to turn off the third semiconductor device.

9. The method of claim 2 wherein providing the bias voltage for the integrated circuit to the gate of the PMOS (P-channel Metal Oxide Semiconductor) device comprises providing the bias voltage for the integrated circuit to the gate of the PMOS (P-channel Metal Oxide Semiconductor) through a second plurality of diode connected MOS devices in response to the turn off of the first semiconductor device.

10. A method of protecting an integrated circuit from over voltage, the method comprising:

accepting a voltage from a power supply input to the integrated circuit;

accepting a pad voltage via a pad from an external voltage source to the integrated circuit; and if the power supply voltage has a first value less than a predetermined value:

turning off a first switch disposed between the pad and a gate terminal of a second switch disposed between the pad and a bias node; and turning on a third switch disposed between the bias node and the gate terminal of the second switch, thereby turning on the second switch to provide a bias voltage for the integrated circuit at the bias node;

wherein the pad voltage is applied at the bias node as the bias voltage through a plurality of diode connected transistors and the second switch.

11. A method of protecting an integrated circuit from over voltage, the method comprising:

accepting a voltage from a power supply input to the integrated circuit;

accepting a pad voltage via a pad from an external voltage source to the integrated circuit; and if the power supply voltage has a first value less than a predetermined value:

turning off a first switch disposed between the pad and a gate terminal of a second switch disposed between the pad and a bias node; and turning on a third switch disposed between the bias node and the gate terminal of the second switch, thereby turning on the second switch to provide a bias voltage for the integrated circuit at the bias node;

wherein said turning off the first switch comprises applying the pad voltage at a gate terminal of the first switch through a plurality of diode connected transistors.

12. The method of claim 11, wherein said applying the pad voltage comprises turning on a fourth switch disposed between the gate terminal of the first switch and the pad voltage.

13. A method of protecting an integrated circuit from over voltage, the method comprising:

accepting a voltage from a power supply input to the integrated circuit;

accepting a pad voltage via a pad from an external voltage source to the integrated circuit; and if the power supply voltage has a first value less than a predetermined value:

turning off a first switch disposed between the pad and a gate terminal of a second switch disposed between the pad and a bias node; and turning on a third switch disposed between the bias node and the gate terminal of the second switch, thereby turning on the second switch to provide a bias voltage for the integrated circuit at the bias node;

wherein the third switch is coupled to the gate terminal of the second switch through a plurality of diode connected transistors.

14. The method of claim 10, further comprising:

if the power supply voltage has a second value greater than the predetermined value, turning off the second switch, such that the pad voltage is not provided to the bias node through the second switch.

* * * * *

UNITED STATES PATENT AND TRADEMARK OFFICE
CERTIFICATE OF CORRECTION

PATENT NO. : 6,847,248 B2  
APPLICATION NO. : 10/043763  
DATED : January 25, 2005  
INVENTOR(S) : Ajit It is certified that error appears in the above-identified patent and that said Letters Patent is hereby corrected as shown below:

On the Title Page

| | |
|---|---|
| (57) Abstract, line 1 | Delete "input output", Insert --input/output-- |
| (57) Abstract, line 3 | Delete "so does", Insert --so do-- |

In the Claims

| | |
|---|---|
| Column 10, line 47, Claim 3 | Delete "not present", Insert --not present,-- |
| Column 11, line 11, Claim 4 | Delete "not present", Insert --not present,-- |
| Column 11, line 28, Claim 5 | Delete "not present", Insert --not present,-- |
| Column 11, line 57, Claim 6 | After "device", Insert --;-- |
| Column 12, line 19, Claim 7 | Delete "comprises" |
| Column 12, line 32, Claim 9 | After "Semiconductor) ", Insert --device-- |

UNITED STATES PATENT AND TRADEMARK OFFICE
CERTIFICATE OF CORRECTION

| | |
|---|---|
| PATENT NO. | : 6,847,248 B2 |
| APPLICATION NO. | : 10/043763 |
| DATED | : January 25, 2005 |
| INVENTOR(S) | : Ajit |

It is certified that error appears in the above-identified patent and that said Letters Patent is hereby corrected as shown below:

In the Drawings

| | |
|---|---|
| FIG. 4, Sheet 4 of 23 | Delete Drawing Sheet 4 and substitute therefore the Drawing Sheet, consisting of Fig. 4, as shown on the attached page |
| FIG. 6, Sheet 6 of 23 | Delete Drawing Sheet 6 and substitute therefore the Drawing Sheet, consisting of Fig. 6, as shown on the attached page |
| FIG. 9A, Sheet 9 of 23 | Delete Drawing Sheet 9 and substitute therefore the Drawing Sheet, consisting of Fig. 9A,, as shown on the attached page |
| FIG. 10, Sheet 11 of 23 | Delete Drawing Sheet 11 and substitute therefore the Drawing Sheet, consisting of Fig. 10, as shown on the attached page |
| FIG. 11A, Sheet 12 of 23 | Delete Drawing Sheet 12 and substitute therefore the Drawing Sheet, consisting of Fig. 11A, as shown on the attached page |
| FIG. 12A, Sheet 16 of 23 | Delete Drawing Sheet 16 and substitute therefore the Drawing Sheet, consisting of Fig. 12A, as shown on the attached page |

UNITED STATES PATENT AND TRADEMARK OFFICE
CERTIFICATE OF CORRECTION

PATENT NO. : 6,847,248 B2
APPLICATION NO. : 10/043763
DATED : January 25, 2005
INVENTOR(S) : Ajit It is certified that error appears in the above-identified patent and that said Letters Patent is hereby corrected as shown below:

| | |
|---|---|
| FIG. 12B, Sheet 17 of 23 | Delete Drawing Sheet 17 and substitute therefore the Drawing Sheet, consisting of Fig. 12B, as shown on the attached page |
| FIG. 13, Sheet 18 of 23 | Delete Drawing Sheet 18 and substitute therefore the Drawing Sheet, consisting of Fig. 13, as shown on the attached page |
| FIG. 14, Sheet 19 of 23 | Delete Drawing Sheet 19 and substitute therefore the Drawing Sheet, consisting of Fig. 14, as shown on the attached page |
| FIG. 18, Sheet 23 of 23 | Delete Drawing Sheet 23 and substitute therefore the Drawing Sheet, consisting of Fig. 18, as shown on the attached page |

Signed and Sealed this

Twenty-first Day of November, 2006

JON W. DUDAS
*Director of the United States Patent and Trademark Office*